US012796144B2

(12) United States Patent
Tsai et al.

(10) Patent No.: US 12,796,144 B2
(45) Date of Patent: Nov. 10, 2026

(54) IMAGE SENSOR DEVICE AND METHOD OF MANUFACTURING THE SAME

(71) Applicant: Taiwan Semiconductor Manufacturing Company, Ltd., Hsinchu (TW)

(72) Inventors: Shu-Ting Tsai, Kaohsiung City (TW); Tzu-Jui Wang, Fengshan City (TW); U-Ting Chen, Wanluan Township (TW); Shyh-Fann Ting, Tainan City (TW); Szu-Ying Chen, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 402 days.

(21) Appl. No.: 18/480,551

(22) Filed: Oct. 4, 2023

(65) Prior Publication Data

US 2025/0120209 A1 Apr. 10, 2025

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/016* (2025.01); *H10F 39/18* (2025.01)

(58) Field of Classification Search
CPC .... H10F 39/807; H10F 39/014; H10F 39/016; H10F 39/18; H10F 39/011; H10F 39/199; H10F 39/80373
See application file for complete search history.

(56) References Cited

U.S. PATENT DOCUMENTS

| | | | |
|---|---|---|---|
| 8,629,524 B2 | 1/2014 | Wang et al. | |
| 8,957,358 B2 | 2/2015 | Wan et al. | |
| 9,136,302 B2 | 9/2015 | Wang et al. | |
| 10,090,349 B2 | 10/2018 | Wan et al. | |
| 2015/0372031 A1 | 12/2015 | Yoon et al. | |
| 2019/0148434 A1 | 5/2019 | Hsu | |
| 2021/0210532 A1 | 7/2021 | Hung et al. | |
| 2022/0328535 A1 | 10/2022 | Huang et al. | |
| 2022/0344394 A1* | 10/2022 | Noda | H10F 39/80373 |
| 2024/0379709 A1* | 11/2024 | Furusho | H10F 39/12 |

FOREIGN PATENT DOCUMENTS

TW 202322373 A 6/2023

* cited by examiner

*Primary Examiner* — Julia Slutsker
(74) *Attorney, Agent, or Firm* — Eschweiler & Potashnik, LLC

(57) ABSTRACT

The problem of forming a deep trench isolation structure suitable for photodetectors with small pitch is solved by a process in which a grid of trenches is etched from the front side using high energy plasma followed by annealing. The trenches are filled with an oxide followed by etching to recess the oxide. The trench recesses are filled with semiconductor to form a grid-shaped semiconductor structure. After FEOL processing, BEOL processing, attachment to a second substrate, and thinning from the back side, an etch removes the oxide from the back side. The etch stops on the grid-shaped semiconductor structure. The trenches are then lined and filled from the back side. The front side etch allows the trenches to be made narrow and with highly vertical sidewalls. Lining and filling the trenches from the back side provides good optical and electrical isolation.

20 Claims, 38 Drawing Sheets

IMAGE SENSOR DEVICE AND METHOD OF MANUFACTURING THE SAME

BACKGROUND

Integrated circuits (ICs) comprising image sensors are used in a wide range of modern-day electronic devices such as cameras and cell phones. Complementary metal-oxide semiconductor (CMOS) image sensors (CISs) have become popular. Compared to charge-coupled devices (CCDs), CISs are increasingly favored due to low power consumption, small pixel size, fast data processing, and low manufacturing cost. As the pixel sizes are made smaller, manufacturing becomes increasingly difficult as does limiting crosstalk between pixels. These are ongoing challenges where unique solutions can provide improved performance.

BRIEF DESCRIPTION OF THE DRAWINGS

Aspects of the present disclosure are best understood from the following detailed description when read with the accompanying figures. In accordance with standard industry practice, features are not drawn to scale. Moreover, the dimensions of various features within individual drawings may be arbitrarily increased or reduced relative to one-another to facilitate illustration or provide emphasis.

DETAILED DESCRIPTION

Figure 1:
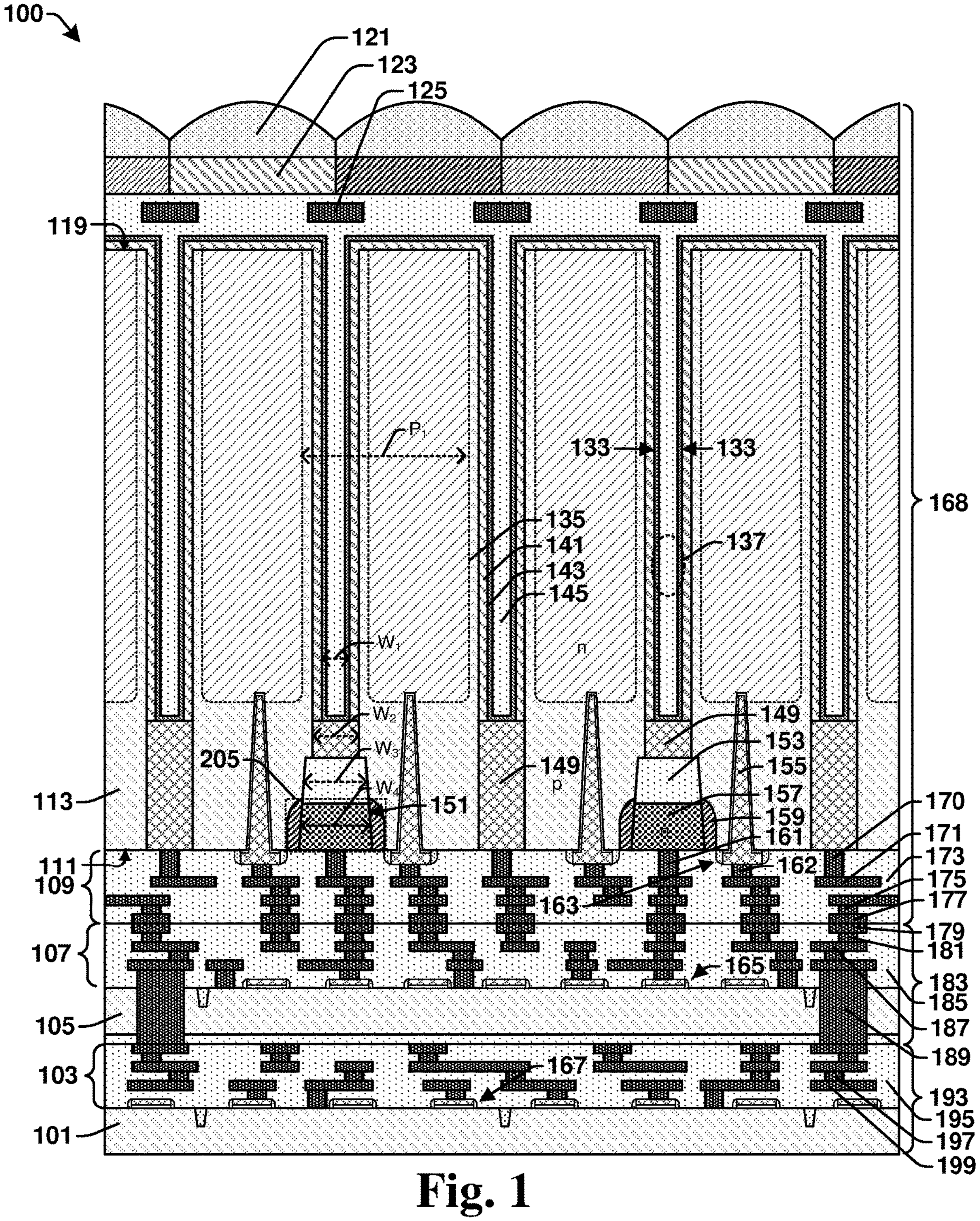
FIG. 1 illustrates a cross-sectional view of an integrated circuit (IC) device according to some aspects of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

Spatially relative terms, such as "beneath," "below," "lower," "above," "upper", and the like, may be used herein to describe one element or feature's relationship to another element(s) or feature(s) as illustrated in the figures. These spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may be interpreted accordingly. Terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

Some CISs are designed for back side illumination (BSI) and include an array of photodetector within a semiconductor substrate. The photodetector pixels may be separated by a deep trench isolation (DTI) structure. The DTI structure may be a back side deep trench isolation (BDTI) structure or a front side deep trench isolation (FDTI) structure. Trenches for a BDTI structure are formed by etching from the back side of the semiconductor substrate and tend to become narrower from back side to front side. Trenches for an FDTI structure are formed by etching from the front side and tend to become narrower from front side to back side. The DTI structure may be in the form of a grid having segments between adjacent photodetectors. It is desirable to make the grid segments narrow. Making the grid segments narrower can increase the area available for light sensing.

BDTI structures provide good electrical and optical isolation, however, their implementation may be costly in terms of front side area due to challenges associated with landing the trenches. For example, if shallow trench isolation (STI) structures are formed in the front side to land the trenches, front side area is taken up by these structures. Additional front side area is set aside to allow for misalignment between structures formed on the front side and trenches etched from the back side. This consumption of front side area presents an obstacle to reducing pixel pitch.

In accordance with some aspects of the present disclosure, the problem of forming a DTI structure suitable for photodetectors with small pitch is solved by a process in which a first mask if formed and used to etch a grid of trenches from the front side of a semiconductor body. The etching may be carried out with higher energy than etching from the back side because substrate damage from the etch process may be repaired by annealing before front side structures that limit the thermal budget are formed. Etching with higher energy allows the trenches to have a higher aspect ratio and to thus be narrower.

After etching, the trenches are filled with a sacrificial material. In some embodiments, the sacrificial material is an oxide. The sacrificial material is recessed within the trenches by an etch process, and the resulting recesses are filled with a first semiconductor. In some embodiments, the first semiconductor is polysilicon. In some embodiments, the first semiconductor is epitaxially grown in the trenches. The first semiconductor deposited in the trenches forms a grid-shaped semiconductor structure that abuts the sacrificial material and provides an etch stop for a subsequent process in which the sacrificial material is removed by etching from the back side.

In some embodiments, a second mask is formed and used to etch holes that extend part way through the grid-shaped semiconductor structure. In some embodiments, the holes are wider than the grid-shaped semiconductor structure. In some embodiments, the holes are formed at crossroads of the grid-shaped semiconductor structure. The holes are filled with a dielectric, followed by etching so that the remaining dielectric forms dielectric islands recessed within the holes. The upper portions of the holes are then filled with a second semiconductor to form semiconductor islands. In some embodiments, the second semiconductor is epitaxially grown in the holes. In some embodiments, the second semiconductor is polysilicon. The semiconductor islands may be in direct contact with the semiconductor body. In some embodiments, the semiconductor islands provide floating diffusion regions. The dielectric islands below the semiconductor islands reduce leakage currents from the floating diffusion regions. Disposing the floating diffusion regions directly above the trenches makes efficient use of the front side area.

After front end of line (FEOL) processing, which may include the formation of photodiodes and transfer gates, and back end of line (BEOL) processing, which includes the formation of a metal interconnect structure over the front side, the semiconductor body may be attached to one or more other substrates. The semiconductor body may then be thinned from the back side at least to the depth of the trenches.

The sacrificial material is removed from the trenches by etching from the back side followed by filling the trenches from the back side to form a DTI structure. The interior surfaces (sidewalls) of the semiconductor body that define the trenches may have defects (e.g., dangling bonds) caused by etching. Left unmitigated, these defects may trap charge carriers (e.g., electrons) and cause an unwanted leakage current to flow between adjacent pixel regions leading to dark current and/or white pixel issues. In some embodiments, filling the trenches comprises forming an epitaxial layer on the trench sidewalls. The epitaxial layer may repair etch damage. In some embodiments, filling the trenches comprises lining the trenches with a high-κ dielectric. The high-κ dielectric may be formed over the epitaxial layer and may also form on the back side. The high-k dielectric passivates defects by forming an electric field that accumulates holes along the sidewalls, thereby passivating the charge carriers (e.g., electrons). A remaining volume of the trenches may be filled with one or more other dielectrics such as oxides. Filling the trenches from the back side provides good electrical and optical isolation similar to what is achieved with a BDTI structure.

Some aspects of the present disclosure relate to an integrated circuit device. The integrated circuit device may be an image sensing device and may be manufactured by the foregoing method. The image sensing device comprises a semiconductor body and an array of light sensing elements disposed within the semiconductor body. The semiconductor body has internal sidewalls that define a grid-shaped trench structure that extends from a second side of the semiconductor body (the back side) and laterally between the light sensing elements. The sidewalls are either vertical or are angled so that the trenches become narrower in the direction of the second side. In some embodiments, semiconductor islands proximate a first side (the front side) of the semiconductor body are directly opposite the segments of the grid-shaped trench structure and are separated from the grid-shaped trench structure by corresponding dielectric islands. The semiconductor islands may be laterally surrounded by semiconductor of opposite doping typing. In some embodiments, the semiconductor islands provide floating diffusion regions for adjacent light sensing elements.

A grid-shaped semiconductor structure is disposed between the grid-shaped trench structure and the first side. The grid-shaped semiconductor structure separates the dielectric islands from the grid-shaped trench structure. In some embodiments, the grid-shaped semiconductor structure is polysilicon or the like. In some embodiments, the grid-shaped semiconductor structure is epitaxially grown semiconductor.

In some embodiments, the dielectric islands are wider than the segments of the grid-shaped trench structure. In some embodiments, the semiconductor islands are wider than the segments of the grid-shaped trench structure. In some embodiments, the semiconductor islands are opposite (directly above) crossroads of the grid-shaped trench structure. In some embodiments, the semiconductor islands are cross-shaped. In some embodiments, the semiconductor islands are opposite segments of the grid-shaped trench structure, but between the cross-roads. In some embodiments, the semiconductor islands are rectangles elongated along corresponding segments of the grid-shaped trench structure.

In some embodiments, the grid-shaped trench structure contains epitaxially grown semiconductor. In some embodiments, the grid-shaped trench structure has a high-k dielectric liner. In some embodiments, the high-k dielectric liner continues onto the second side. In some embodiments, the grid-shaped trench structure is filled with dielectric. In some embodiments, the dielectric that fill the trenches is continuous with a layer of the dielectric on the second side.

FIG. 1 provides a cross-sectional view of an integrated circuit (IC) device 100, which is an image sensing device. The IC device 100 includes an array of photodiodes 135 within a semiconductor body 113. The semiconductor body 113 has internal sidewalls 133 that define a DTI structure 137. The DTI structure 137 is grid-shaped and has segments extending from a back side 119 of the semiconductor body 113 and between the photodiodes 135.

Semiconductor islands 157 are disposed adjacent a front side 111 of the semiconductor body 113 directly opposite segments of the DTI structure 137. A grid-shaped semiconductor structure 149 having substantially the same footprint as the DTI structure 137 is disposed between the semiconductor islands 157 and the DTI structure 137. Dielectric islands 153 are directly between the semiconductor islands 157 and the grid-shaped semiconductor structure 149.

An epitaxial layer 141 may provide the internal sidewalls 133 that define the DTI structure 137. In some embodiments, the epitaxial layer 141 is indistinguishable from the rest of the semiconductor body 113. In some embodiments, the epitaxial layer 141 is distinguishable from the rest of the semiconductor body 113 by composition or crystal structure. The DTI structure 137 includes a high-κ dielectric layer 143 that lines the internal sidewalls 133 and a dielectric core 145. The high-κ dielectric layer 143 and the dielectric core 145 are continuous with layers of these same materials on the back side 119.

The DTI structure 137 has a width W1. In some embodiments, the width W1 is about 100 nm or less. In some embodiments, the width W1 is about 60 nm or less. In some embodiments, the width W1 is in the range from about 30 nm to about 50 nm. These widths pertain to the DTI structure 137 being sufficiently narrow to maintain a large full well capacity and sufficiently wide to inhibit crosstalk.

The grid-shaped semiconductor structure 149 has a width W2. The width W2 is approximately the same as the width W1 plus two times a thickness of the epitaxial layer 141. In some embodiments, the epitaxial layer 141 is absent and the width W2 is approximately equal to the width W1. In some embodiments, the thickness of the epitaxial layer 141 is in the range from about 10 nm to about 100 nm. In some embodiments, the thickness of the epitaxial layer 141 is in the range from about 20 nm to about 50 nm.

The dielectric islands 153 have a width W3 that is equal to or greater than the width W2. In some embodiments, the width W3 is approximately equal to the width W2. In some embodiments, the width W3 is from zero to about 100% greater than the width W2. In some embodiments, the width W3 is from 10% to about 50% greater than the width W2. The width W4 may be approximately the same as the width W3 or may be slightly greater do to a slope of the internal sidewalls 151 of the semiconductor body 113 that surround both the dielectric islands 153 and the semiconductor islands 157. In some embodiments, the width W4 is within about 20% of the width W3. In some embodiments, the width W4 is within about 10% of the width W3.

A bulk of the semiconductor body 113 may have p-type doping. The semiconductor islands 157 may have n-type doping. N-wells 159 may abut the semiconductor islands 157. The semiconductor islands 157 together with the N-wells 159 may provide floating diffusion regions 205 that can hold an electrical charge. Transfer gates 163 may be configured to selectively transfer charges from the photodiodes 135 to the semiconductor islands 157. In some embodiments, the transfer gate electrodes 155 are vertical transfer gates. Vertical transfer gates facilitate reducing pixel pitch.

Figure 2:
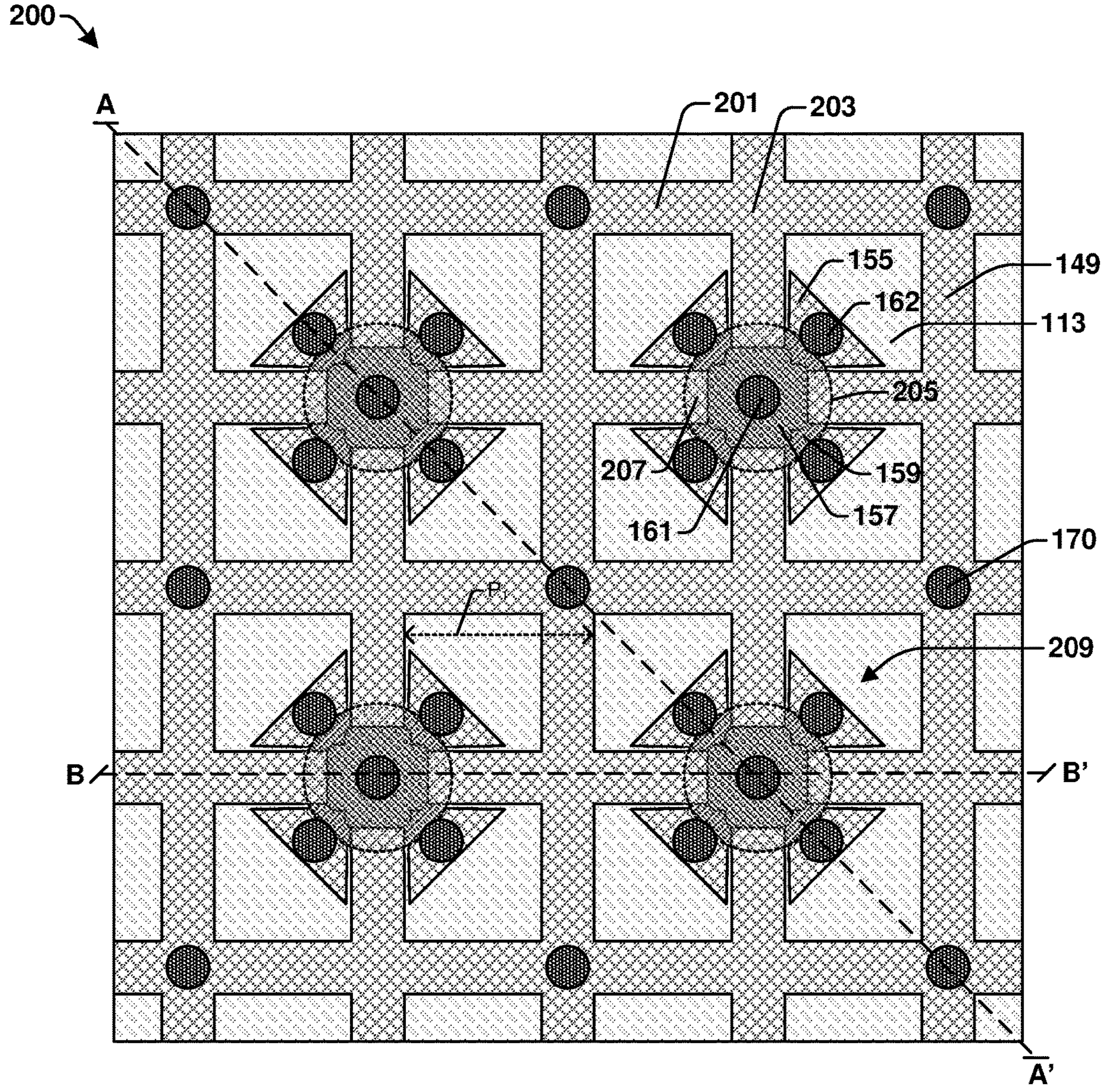
FIG. 2 illustrates a plan view of the IC device of FIG. 1 in accordance with some embodiments.

FIG. 2 illustrates a plan view 200 of the IC device 100 in accordance with some embodiments. The plan view 200 focuses on structures near the front side 111 (see FIG. 1). The line A-A' in FIG. 2 corresponds with the cross-section of FIG. 1. As shown in FIG. 2, the grid-shaped semiconductor structure 149 includes segments 201 that meet at crossroads 203. The semiconductor islands 157 are at the crossroads 203 for every other row and every other column in the grid so that there is one floating diffusion region 205 for every four photodetector pixels 209. The floating diffusion regions 205 comprise semiconductor islands 157 and n-wells 159. The floating diffusion regions 205 may further comprise n-doped areas 207 of the grid-shaped semiconductor structure 149. The grid-shaped semiconductor structure 149 is proximate the front side 111 except where it is interrupted by the semiconductor islands 157.

The photodetector pixels 209 have a pitch P1. In some embodiments, the pitch P1 is the range from about 0.2 μm to about 0.4 μm. In some embodiments, the pitch P1 is about 0.3μm or less. In some embodiments, the pitch P1 is about 0.25 μm or less.

Figure 3:
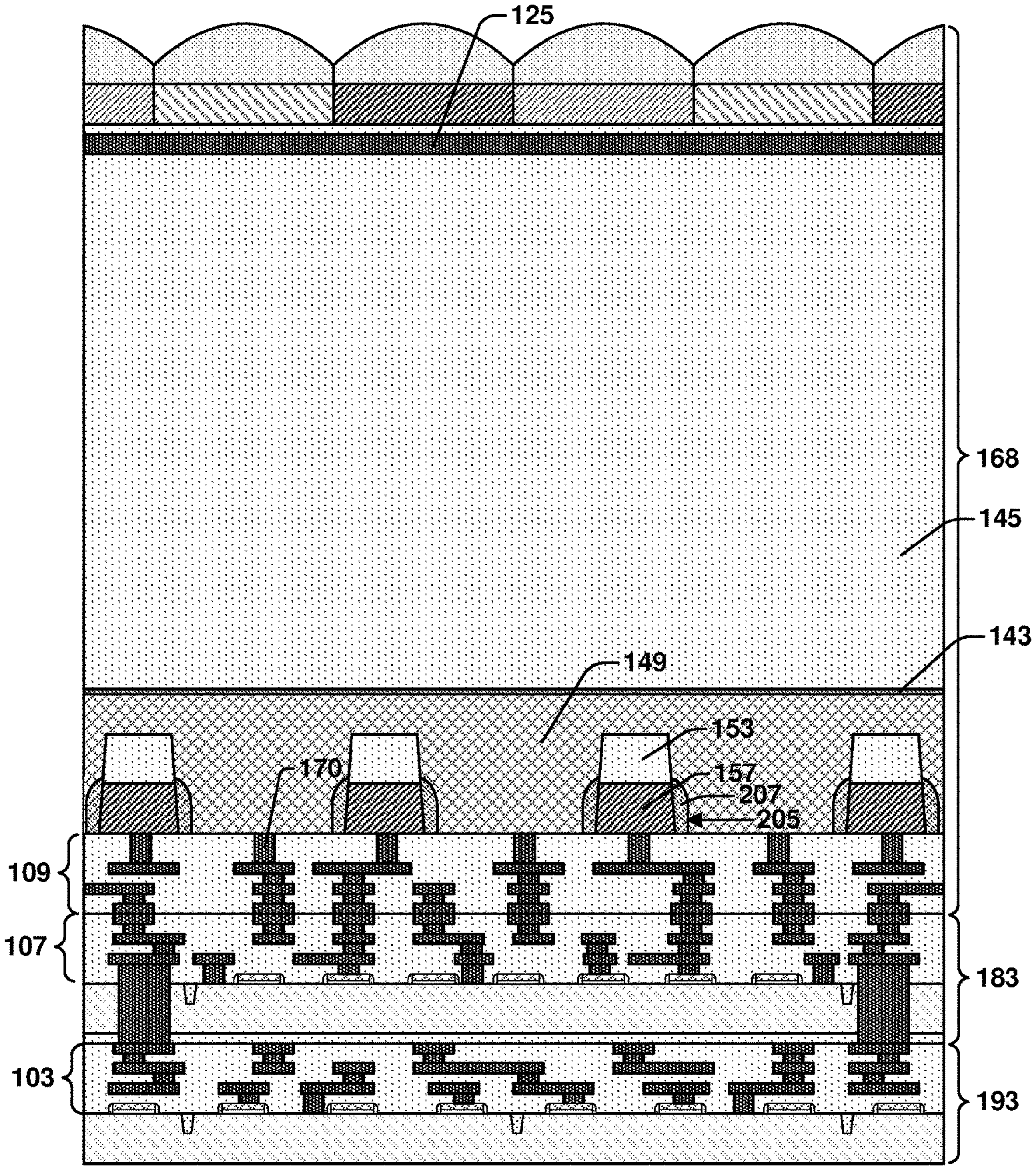
FIG. 3 illustrates another cross-sectional view of the IC device of FIG. 1.

FIG. 3 illustrates a cross-sectional view of the IC device 100 corresponding to the line B-B' of FIG. 2. As shown in FIG. 3, the dielectric islands 153 provide insulation on a lower side of the floating diffusion regions 205. Charges may be held in the floating diffusion regions 205 due to n-type doping in the semiconductor islands 157 and the n-doped areas 207 in compassion to the p-type doping of the grid-shaped semiconductor structure 149 in the surrounding area.

Returning to FIG. 1, a metal interconnect structure 109 may be disposed on the front side 111. The metal interconnect structure 109 comprises wires 171 arranged in a plurality of metallization layers interconnected by vias 175 and surrounded by interlevel dielectric 173. Contacts 162 couple wires 171 to the transfer gates 163 and contacts 161 couple wires 171 to the semiconductor islands 157. Contacts 170 may also be provided so as to couple wires 171 to the grid-shaped semiconductor structure 149. Through the contacts 170, a ground voltage or other bias voltage may be applied to the grid-shaped semiconductor structure 149 in order to improve electrical isolation.

The semiconductor body 113 and the metal interconnect structure 109 comprise a first chip 168. The first chip 168 may be bonded to a second chip 183. The second chip 183 comprises a semiconductor substrate 105 and a metal interconnect structure 107. The metal interconnect structure 107 comprises wires 187 arranged in a plurality of metallization layers interconnected by vias 181 and surrounded by interlevel dielectric 185. Bonding pads 179 on the second chip 183 may be coupled to bonding pads 177 on the first chip 168 to provide communication between the two chips. Transistors 165 and other integrated circuit devices on the second chip 183 may provide in-pixel circuitry, which is circuitry that is repeated for each photodetector pixel 209 or for each floating diffusion region 205. The transistors 165 may include, for example, select gates, source followers, and reset gates. Placing the in-pixel circuitry on the second chip 183 facilitates reducing the pixel pitch on the first chip 168.

The second chip 183 may be bonded to a third chip 193. The third chip 193 includes a semiconductor body 101 and a metal interconnect structure 103. The metal interconnect structure 103 comprises wires 199 arranged in a plurality of metallization layers interconnected by vias 197 and surrounded by interlevel dielectric 195. Through substrate vias (TSVs) 189 may provide connections between the wires 187 on the second chip 183 and the wires 199 on the third chip. Transistors 167 and other integrated circuit devices may be formed on the semiconductor body 101. The transistors 167 and other integrated circuit devices on the third chip 193 may provide application specific circuits that interface with the array of photodetector pixels 209.

There are various ways in which contact pads for connecting to external devices may be implemented in the IC device 100. One option to provide the contact pads on the back side 119 of the first chip 168. The contacts pads may be in a peripheral area, which is outside the image sensing area shown in the illustration. TSVs (not shown) passing through the semiconductor body 113 may provide connections between the contact pads and the wires 171 of the metal interconnect structure 109. Another option is to provide contact pads on the back side of the third chip 193. TSVs (not shown) passing through the semiconductor body 101 may provide connections between the contact pads on the back side of the third chip 193 and the wires 199 of the metal interconnect structure 103.

Figure 4:
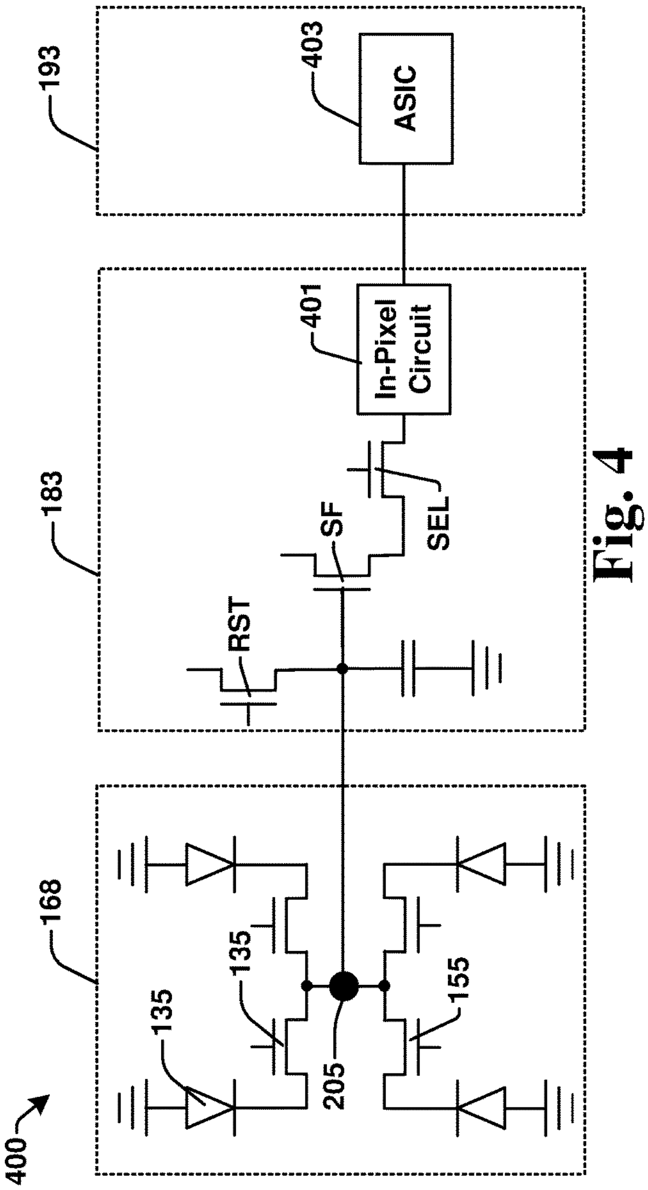
FIG. 4 illustrates a circuit diagram for the IC device of FIG. 1.

FIG. 4 provides a diagram for a circuit 400 that may be implemented by the IC device 100 of FIG. 1. In the circuit 400, the first chip 168 provides four photodiodes 135 coupled to a floating diffusion region 205. The second chip 183 provides a reset gate RST, a source follower SF, a select gate SEL, and or other in pixel circuitry 401. The third chip 193 provides an application specific integrated circuit (ASIC) 403. The floating diffusion region 205 on the first chip 168 is coupled to structures on the second chip 183 that include a source/drain region of the reset gate RST and a gate electrode of the source follower SF.

Figure 5:
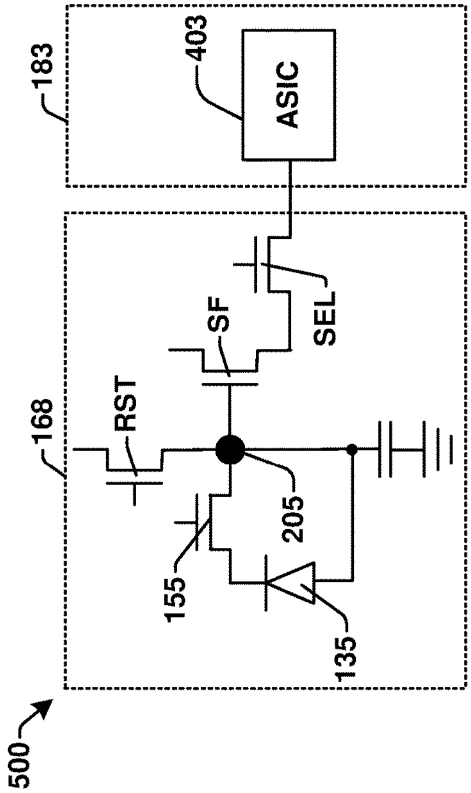
FIG. 5 illustrates a circuit diagram for IC devices according to some other embodiments.

FIG. 5 provides a diagram for a circuit 500 according to an alternate embodiment. In this alternate embodiment, the resent gate RST, the source follower SF, and the select gate SEL are all provided on the first chip 168. Some or all of these transistors may be disposed over the grid-shaped semiconductor structure 149. The second chip 183 may provide the ASIC 403 and the third chip 193 may be eliminated.

Figure 6:
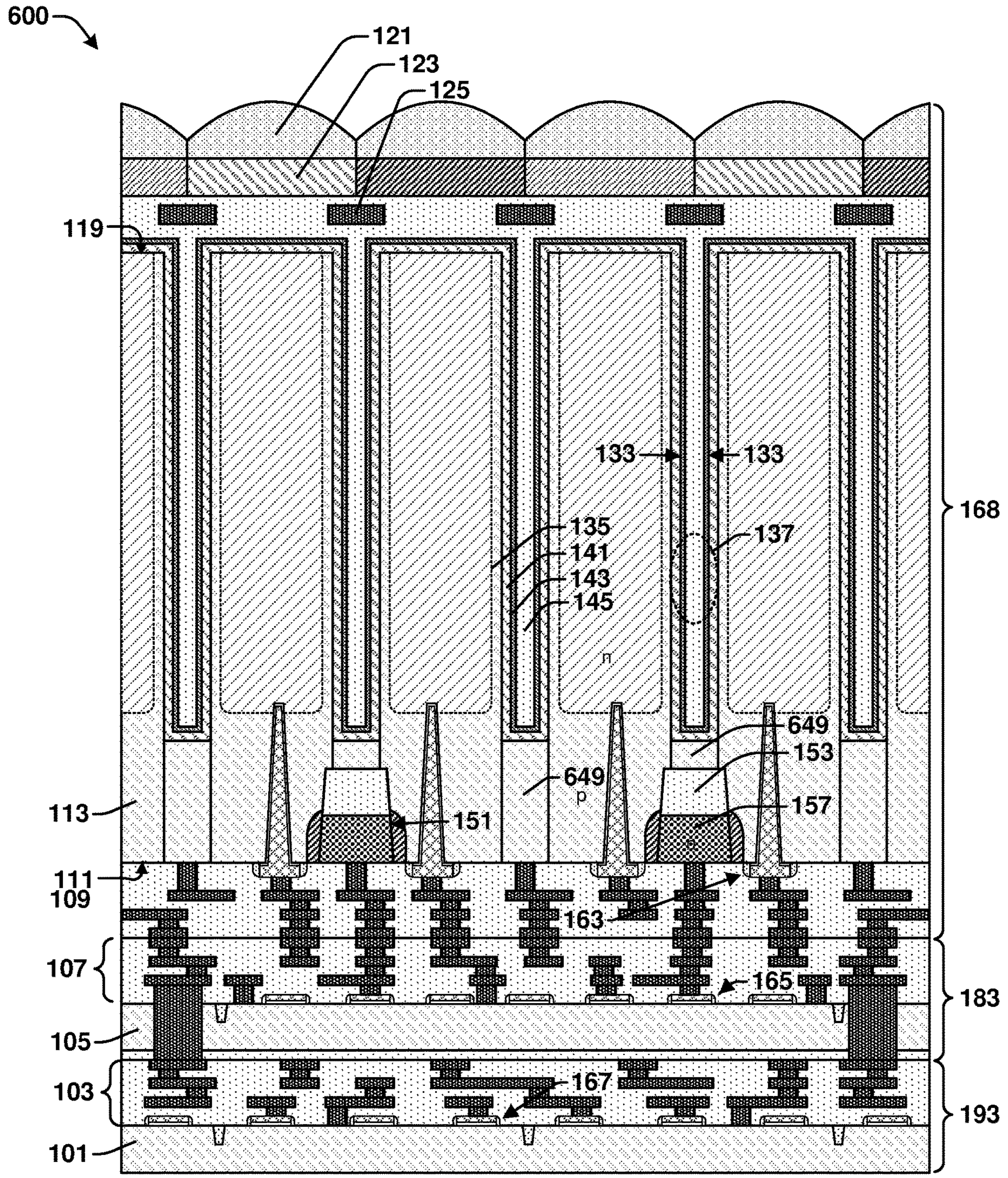
FIG. 6 illustrates a cross-sectional view of an IC device according to another embodiment.

FIG. 6 illustrates a cross-sectional view of an IC device 600. The IC device 600 is like the IC device 100 of FIG. 1 except that the grid-shaped semiconductor structure 149 is replaced by the grid-shaped semiconductor structure 649. Whereas the grid-shaped semiconductor structure 149 is polysilicon or the like, the grid-shaped semiconductor structure 649 is epitaxially grown silicon (Si) or the like. Forming the grid-shaped semiconductor structure 649 with epitaxially grown semiconductor makes it more suitable for providing transistors channels or source/drain regions as compared to the grid-shaped semiconductor structure 149 of polysilicon.

Figure 7:
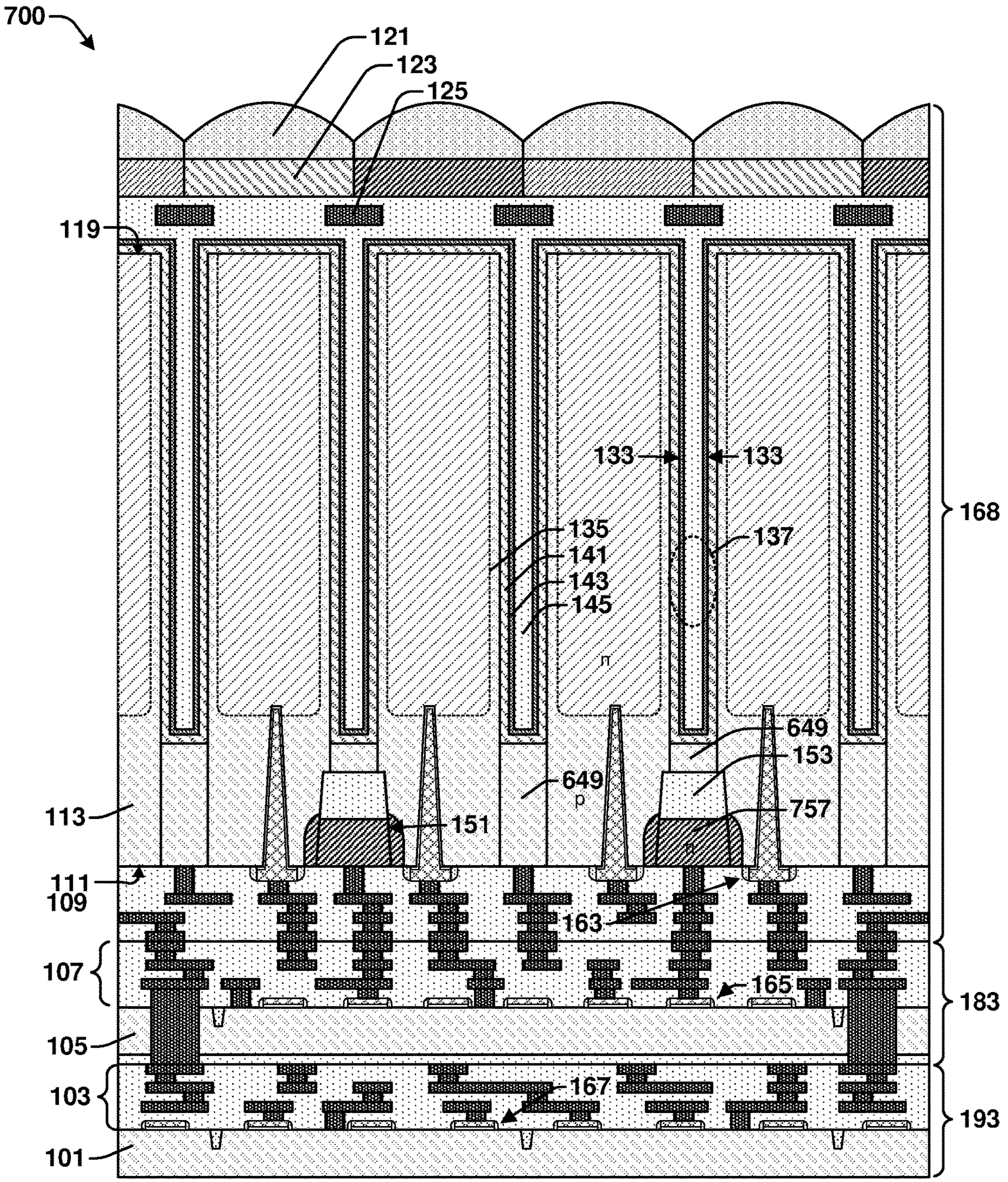
FIG. 7 illustrates a cross-sectional view of an IC device according to another embodiment.

FIG. 7 illustrates a cross-sectional view of an IC device 700. The IC device 700 is like the IC device 600 of FIG. 6 except that the semiconductor islands 157, which are polysilicon or the like, have been replaced by semiconductor islands 757, which are epitaxially grown silicon (Si) or the like. Forming the semiconductor islands 757 with epitaxially grown semiconductor makes them easier to implant uniformly with dopants as compared to the semiconductor islands 157.

Figure 8:
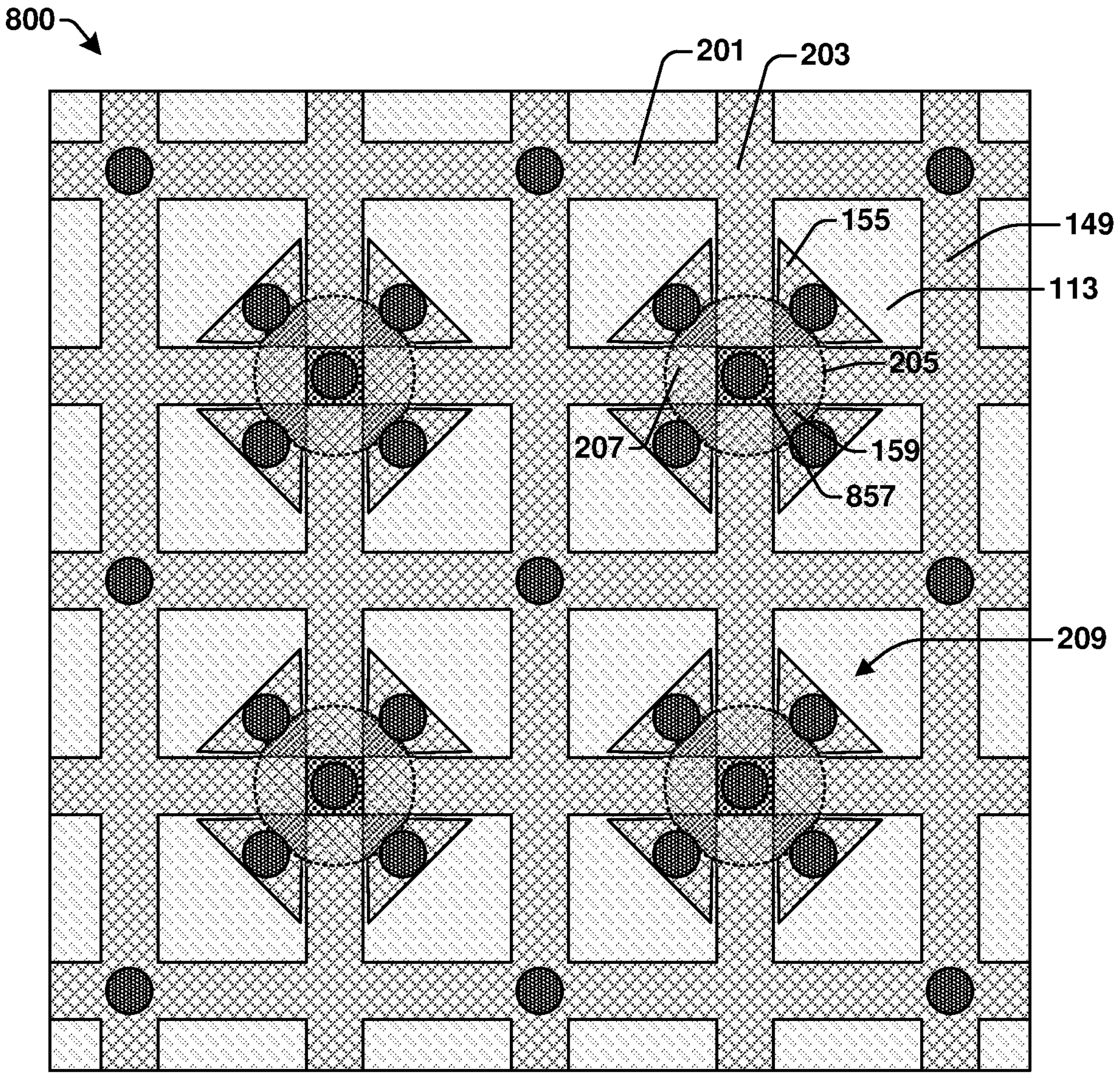
FIGS. 8-12 illustrate plan views of IC devices according to various other embodiments.

FIG. 8 illustrates a plan view 800 of an IC device in accordance with another embodiment. In the plan view 800, the floating diffusion regions 205 comprise semiconductor islands 857. The semiconductor islands 857 are square-shaped, have the same width as the segments 201, and are located at crossroads 203. The semiconductor islands 857 are smaller than the semiconductor islands 157 (see FIG. 2). The smaller semiconductor islands may provide a more compact structure.

Figure 9:
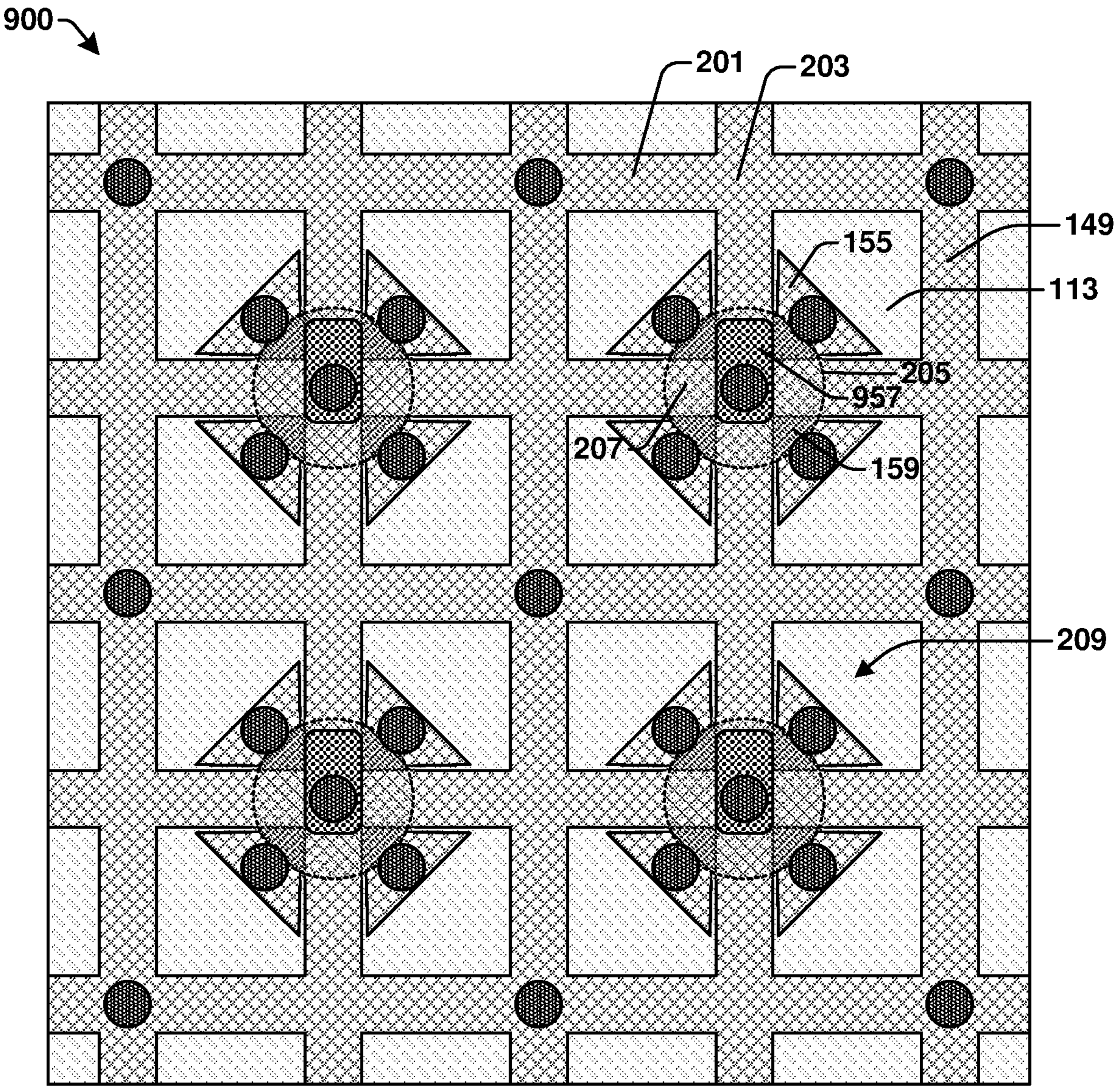

FIG. 9 illustrates a plan view 900 of an IC device in accordance with another embodiment. In the plan view 900, the floating diffusion regions 205 comprise semiconductor islands 957. The semiconductor islands 957 are rectangular, have the same width as the segments 201, and are located at crossroads 203. The semiconductor islands 957 are elongated in comparison to the semiconductor islands 857 (see FIG. 8). The elongation allows the semiconductor islands 957 to be larger while remaining within the footprint of the grid-shaped semiconductor structure 149.

Figure 10:
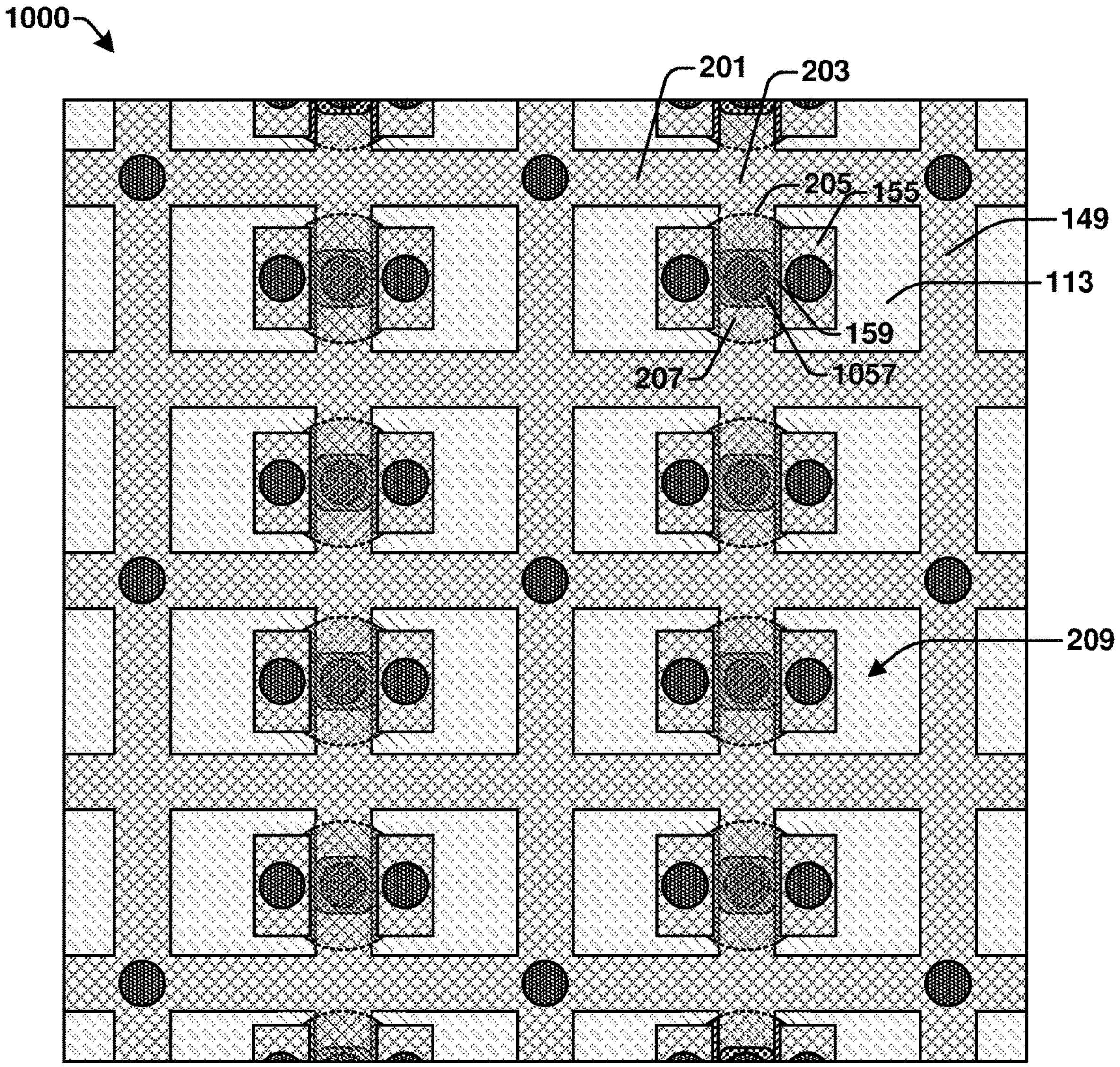

FIG. 10 illustrates a plan view 1000 of an IC device in accordance with another embodiment. In the plan view 1000, the floating diffusion regions 205 comprise semiconductor islands 1057. The semiconductor islands 1057 are square-shaped, have the same width as the segments 201, and are located along the segments 201 between crossroads 203. In this example, each of the floating diffusion regions 205 serves two photodetector pixels 209 and has two associated transfer gate electrodes 155.

Figure 11:
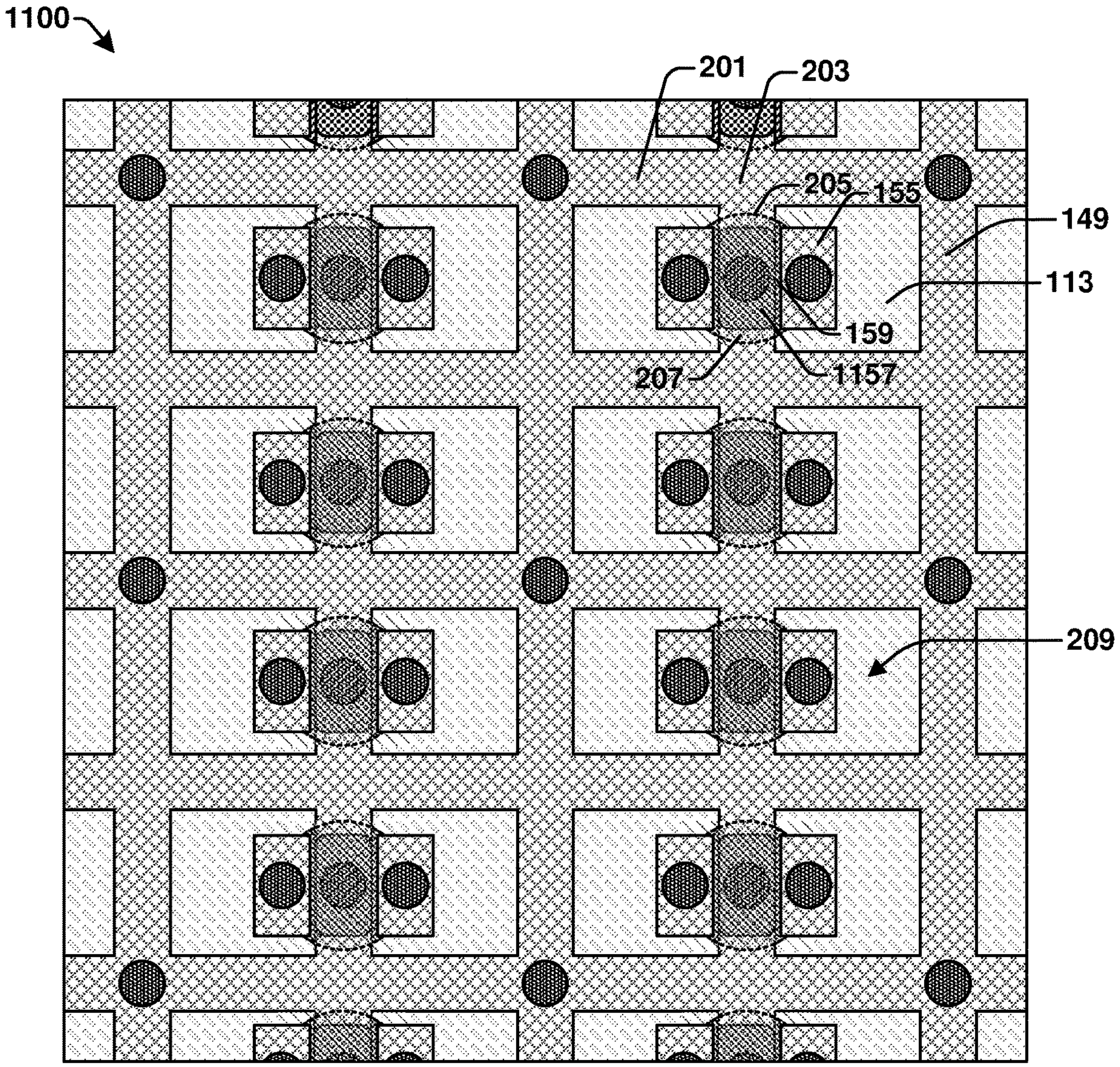

FIG. 11 illustrates a plan view 1100 of an IC device in accordance with another embodiment. In the plan view 1100, the floating diffusion regions 205 comprise semiconductor islands 1157. The semiconductor islands 1157 are rectangular, have the same width as the segments 201, and are located along the segments 201 between crossroads 203. The semiconductor islands 1157 are elongated along the corresponding segments 201. The elongation allows the semiconductor islands 1157 to be larger than the semiconductor islands 1057 (see FIG. 10).

Figure 12:
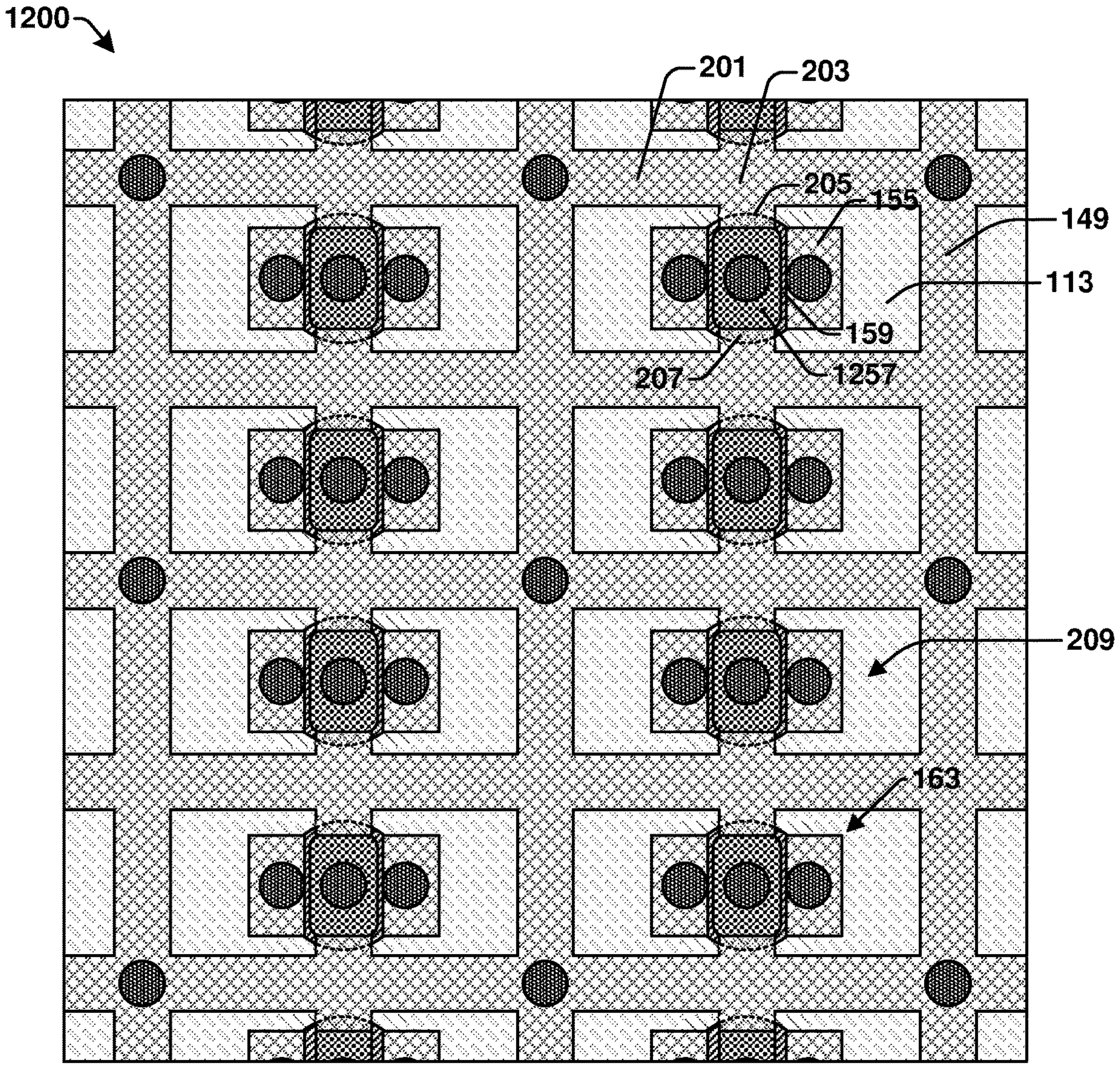

FIG. 12 illustrates a plan view 1200 of the IC device in accordance with another embodiment. In the plan view 1200, the floating diffusion regions 205 comprise semiconductor islands 1257. The semiconductor islands 1257 are rectangular, are wider than the segments 201, and are located along the segments 201 between crossroads 203. Making the semiconductor islands 1257 wider than the segments 201 helps reduce variations in threshold voltages among the transfer gates 163.

FIGS. 13-35 provide a series of cross-sectional views 1300-3500 that illustrate an integrated circuit device according to the present disclosure at various stages of manufacture according to a process of the present disclosure. Although FIGS. 13-35 are described in relation to a series of acts, it will be appreciated that the order of the acts may in some cases be altered and that this series of acts are applicable to structures other than the ones illustrated. In some embodiments, some of these acts are omitted in whole or in part. Furthermore, FIGS. 13-35 are described in relation to a series of acts, it will be appreciated that the structures shown in FIGS. 13-35 are not limited to a method of manufacture but rather may stand alone as structures separate from the method.

Figure 13:
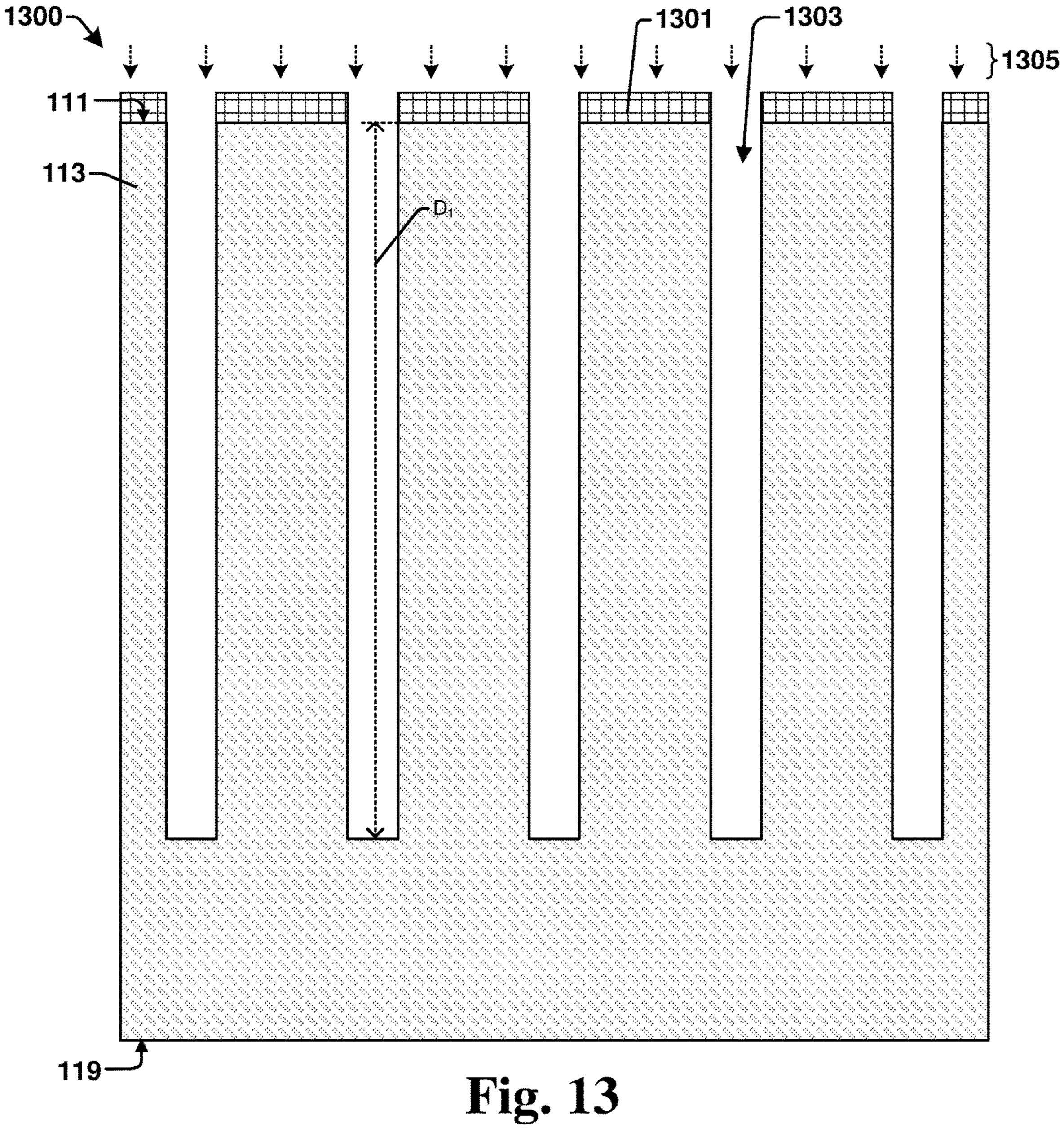
FIGS. 13-35 provide a series of cross-sectional views illustrating a process according to some embodiments.

As illustrated by the cross-sectional view 1300 of FIG. 13, the method may begin with forming a mask 1301 on the front side 111 of the semiconductor body 113 and using the mask 1301 to etch a grid of trenches 1303. The mask 1301, and other masks used throughout this process, may be patterned by photolithography, ion beam lithography, the like, or any other suitable method. The mask 1301 may include a photoresist mask and a hard mask patterned using the photoresist mask. The semiconductor body 113 may be cut from a single crystal and may be any type of semiconductor, e.g., silicon (Si), a group III-V, some other binary semiconductor, a tertiary semiconductor (e.g., AlGaAs), a higher order semiconductor, or the like. In some embodiments, the semiconductor body 113 is or comprises silicon (Si) or the like.

The process of etching the trenches 1303 may include a dry etch such as a plasma etch. The plasma may include high energy ions 1305 so that the trenches 1303 form with substantially vertical sidewalls. In some embodiments, the trenches 1303 have an aspect ratio of 20:1 or greater. In some embodiments, the trenches 1303 have an aspect ratio of 25:1 or greater. In some embodiments, the trenches 1303 have an aspect ratio of 30:1 or greater. In some embodiments, the mask 1301 is substantially removed by the etch process. The trenches 1303 are etched to a depth D1 below the front side 111. In some embodiments, the depth D1 is in the range from about 7 μm to about 3 μm. In some embodiments, the depth D1 is in the range from about 1 μm to about 3 μm. The depth D1 may be selected so as to be greater than a thickness that the semiconductor body 113 will have after a subsequent wafer thinning process.

Figure 14:
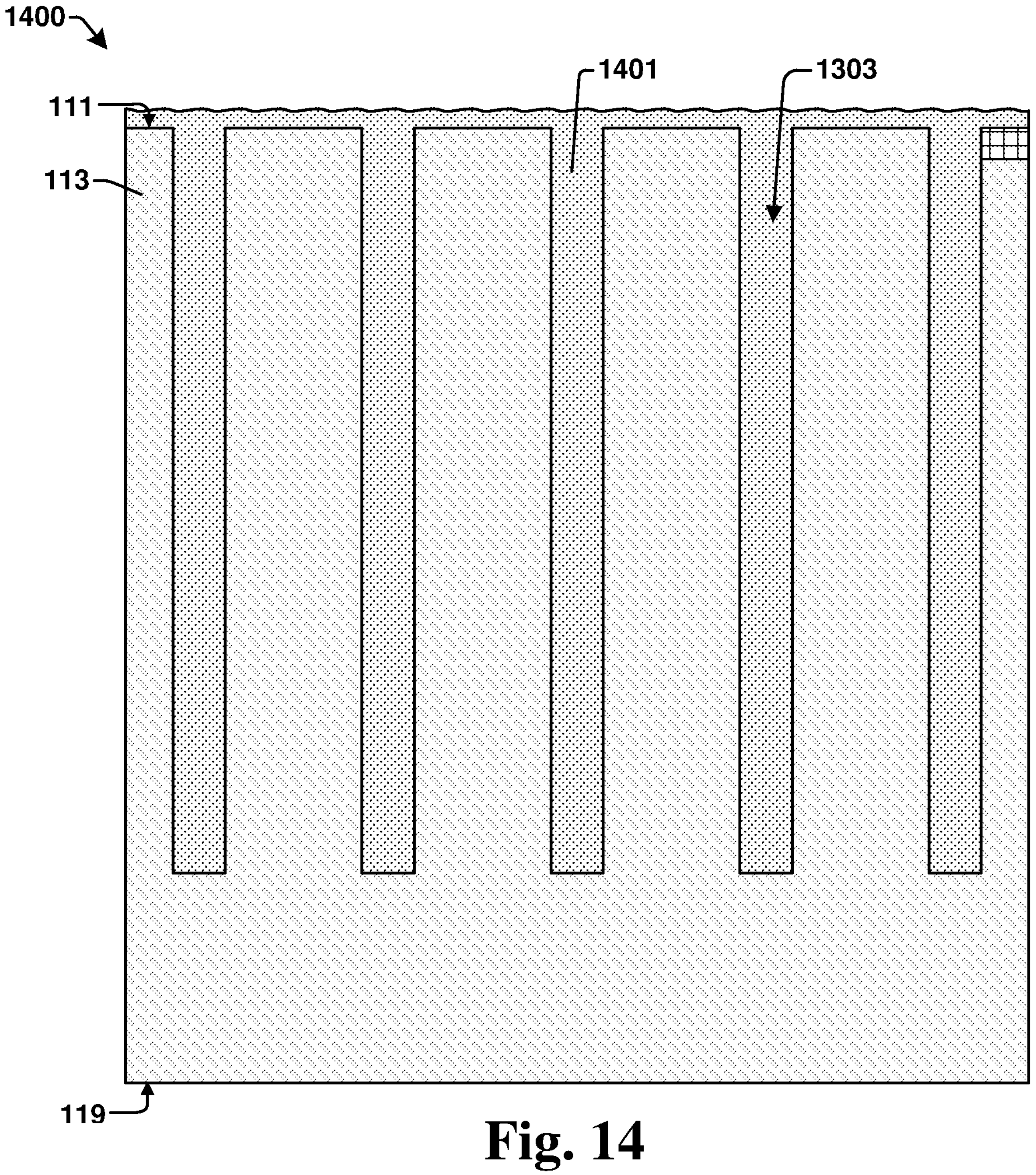

As illustrated by the cross-sectional view 1400 of FIG. 14, the process may continue by filling the trenches 1303 with sacrificial material 1401. The sacrificial material 1401 is one that has an etch susceptibility in contrast with the semiconductor body 113. In some embodiments, the sacrificial material 1401 is one or more layers of dielectric. In some embodiments, the sacrificial material 1401 comprises an oxide. In some embodiments, the oxide is silicon dioxide ($SiO_2$). The sacrificial material 1401 may be deposited by physical vapor deposition (PVD), chemical vapor deposition (CVD), atomic layer deposition (ALD), the like, or any other suitable process. In some embodiments, a base layer of the sacrificial material 1401 is formed by a thermal oxidation process. The thermal oxidation process may be used to remove a damaged layer of the semiconductor body 113 that borders the trenches 1303.

Figure 15:
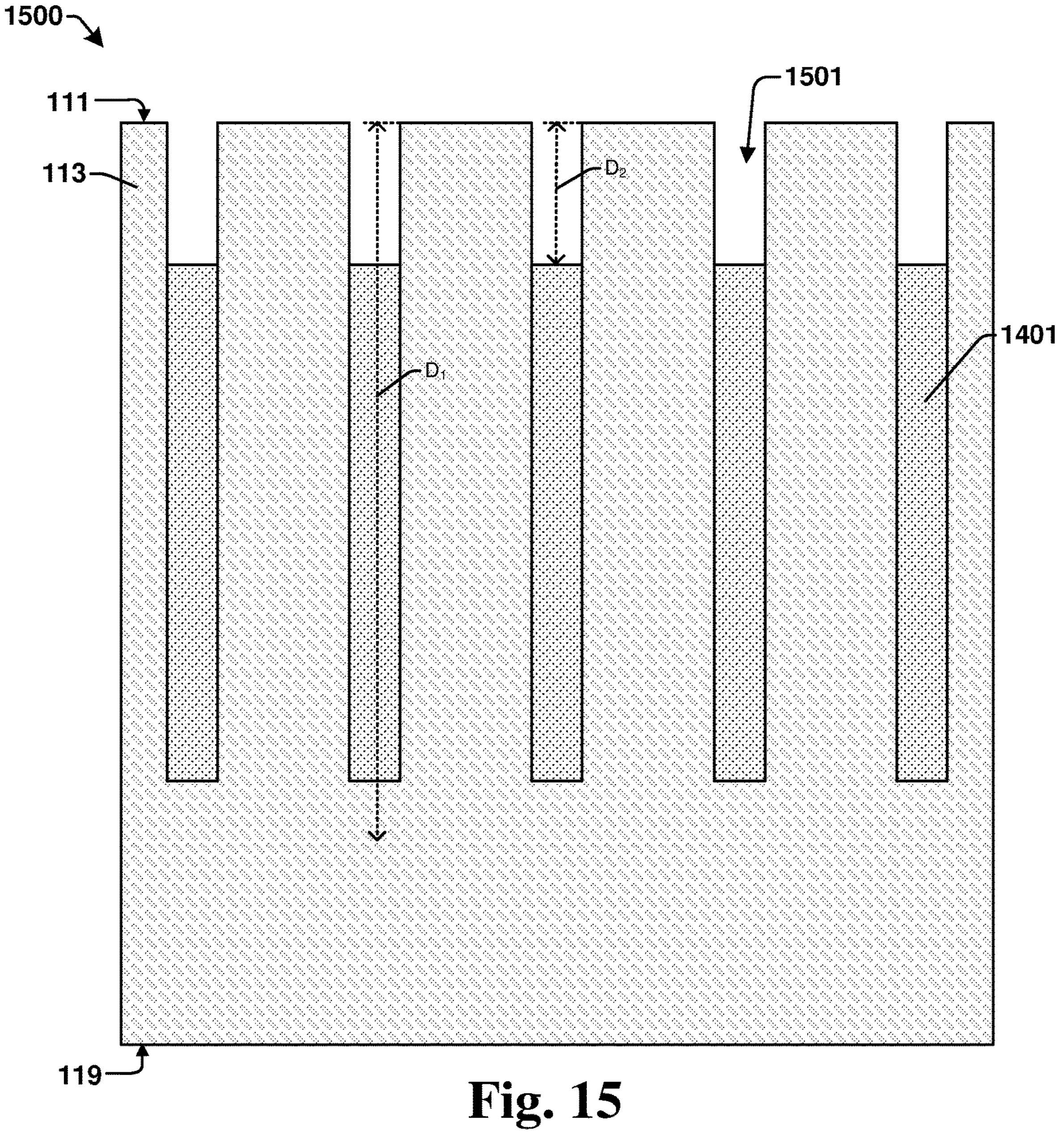

As illustrated by the cross-sectional view 1500 of FIG. 15, excess sacrificial material 1401 is removed from the front side 111 and the sacrificial material 1401 is etched so that it is recessed below the front side 111 leaving a grid of trenches 1501 above the sacrificial material 1401. The sacrificial material 1401 may be removed from the front side 111 by a planarization process or by an etch process. The planarization process may be, for example, chemical mechanical polishing (CMP) or the like. Alternatively, or in addition, the sacrificial material 1401 is removed from the front side 111 by an etch process. The etch process may be the same etch process that is used to recess the sacrificial material 1401 below the front side 111 or may be a different etch process. The etch process(es) may include wet etching, dry etching, the like, or any other suitable processes. The sacrificial material 1401 is etched to a depth D2 below the front side 111. In some embodiments, the depth D2 is in the range from about 20 nm to about 100 nm. In some embodiments, the depth D2 is in the range from about 100 nm to about 800 nm. The depth D2 is much less than the depth D1. In some embodiments, the depth D2 is about ¼ or less the depth D1.

Figure 16:
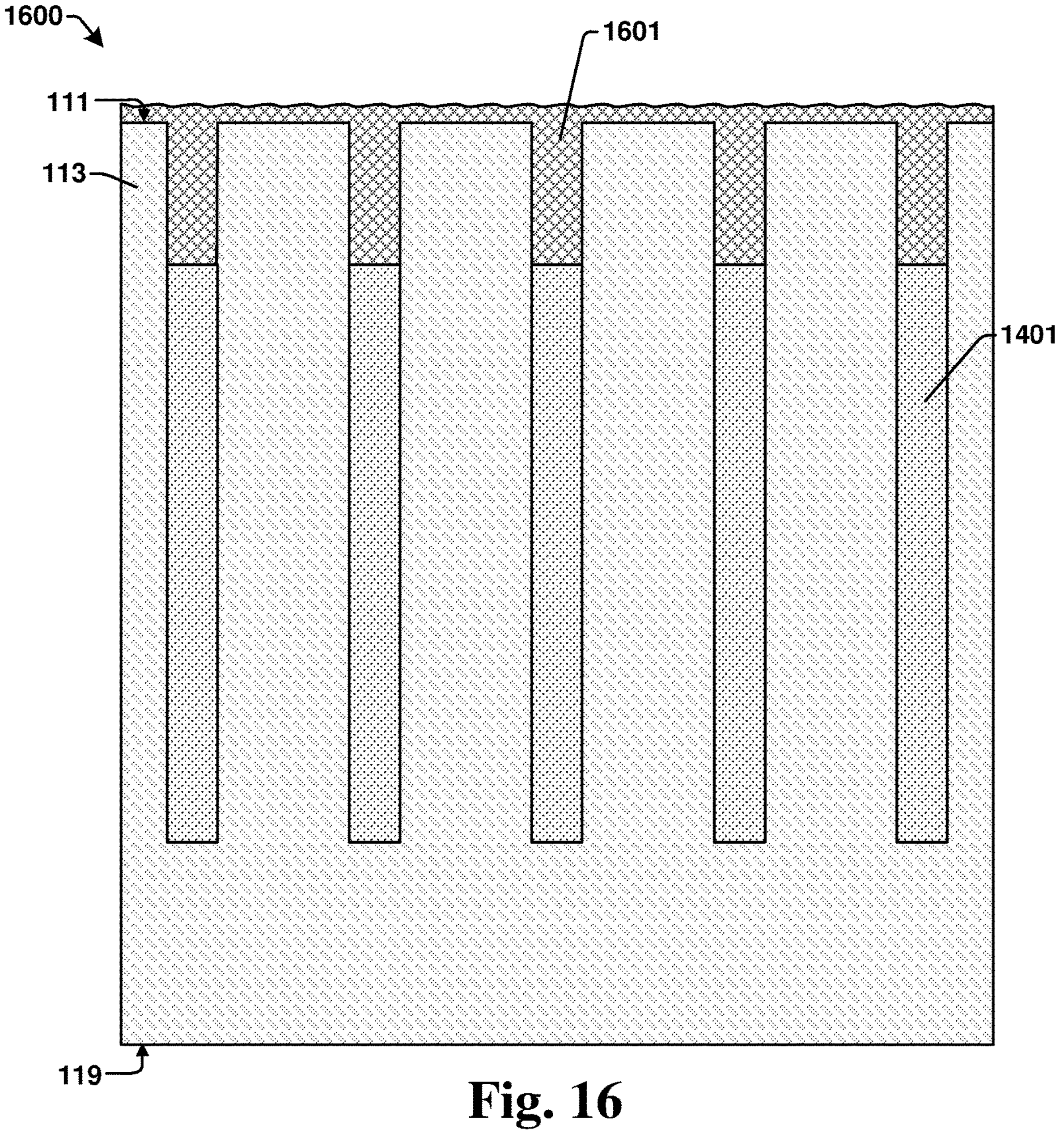

As illustrated by the cross-sectional view 1600 of FIG. 16, the process may continue by filling the grid of trenches 1501 with semiconductor 1601. In some embodiments, the semiconductor 1601 is polysilicon or the like. The semiconductor 1601 may be deposited by physical vapor deposition (PVD), chemical vapor deposition (CVD), atomic layer deposition (ALD), the like, or any other suitable process. In some embodiments, the semiconductor 1601 has p-type doping. P-type doping in the semiconductor 1601 can improve isolation between photodiode pixels.

Figure 17:
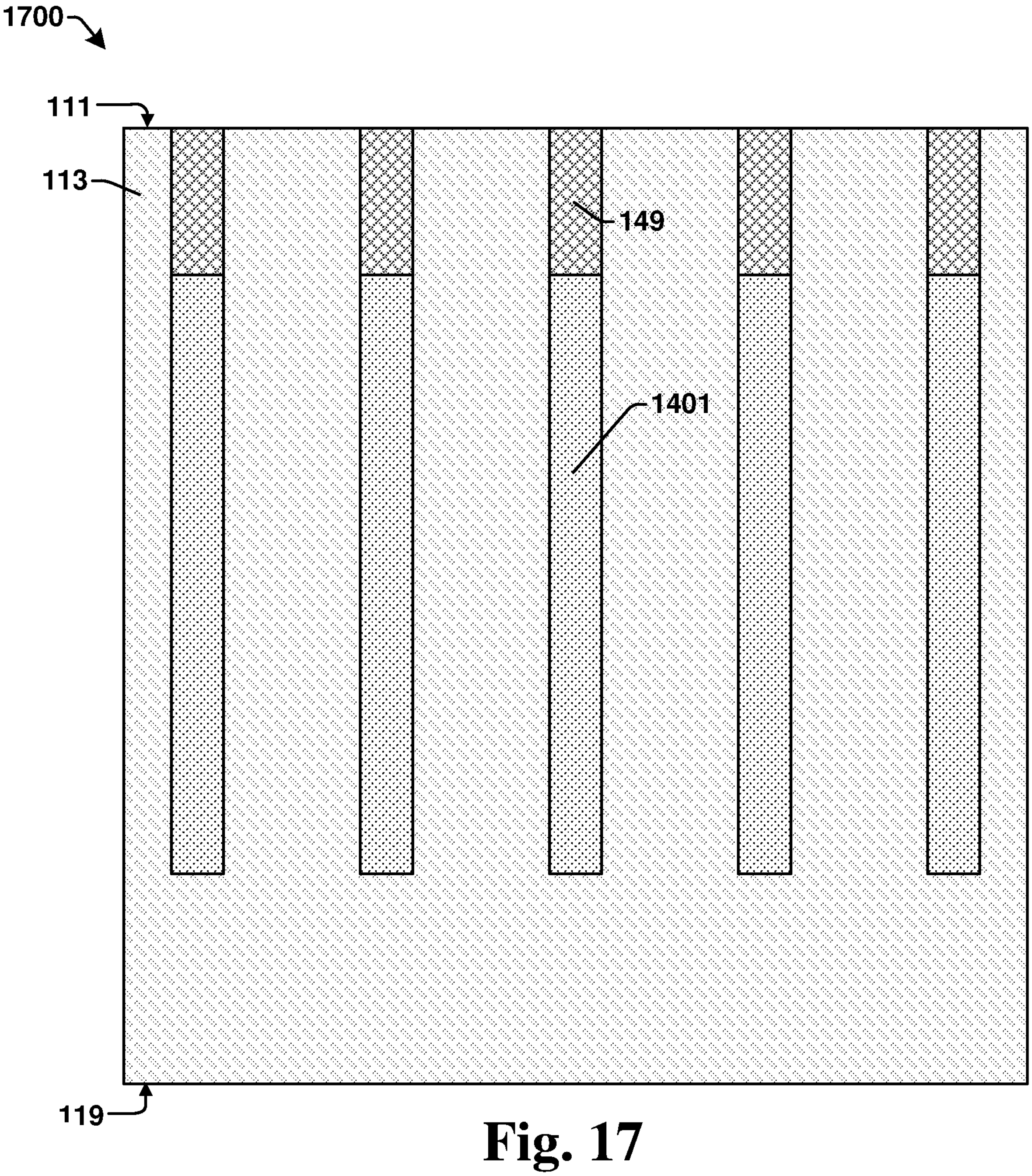

As illustrated by the cross-sectional view 1700 of FIG. 17, excess semiconductor 1601 is removed from the front side 111. The remaining semiconductor 1601 forms the grid-shaped semiconductor structure 149. In some embodiments, the removal process is an etch process. In some embodiments, the removal process is a planarization process. The planarization process may be, for example, CMP or the like.

Figure 18:
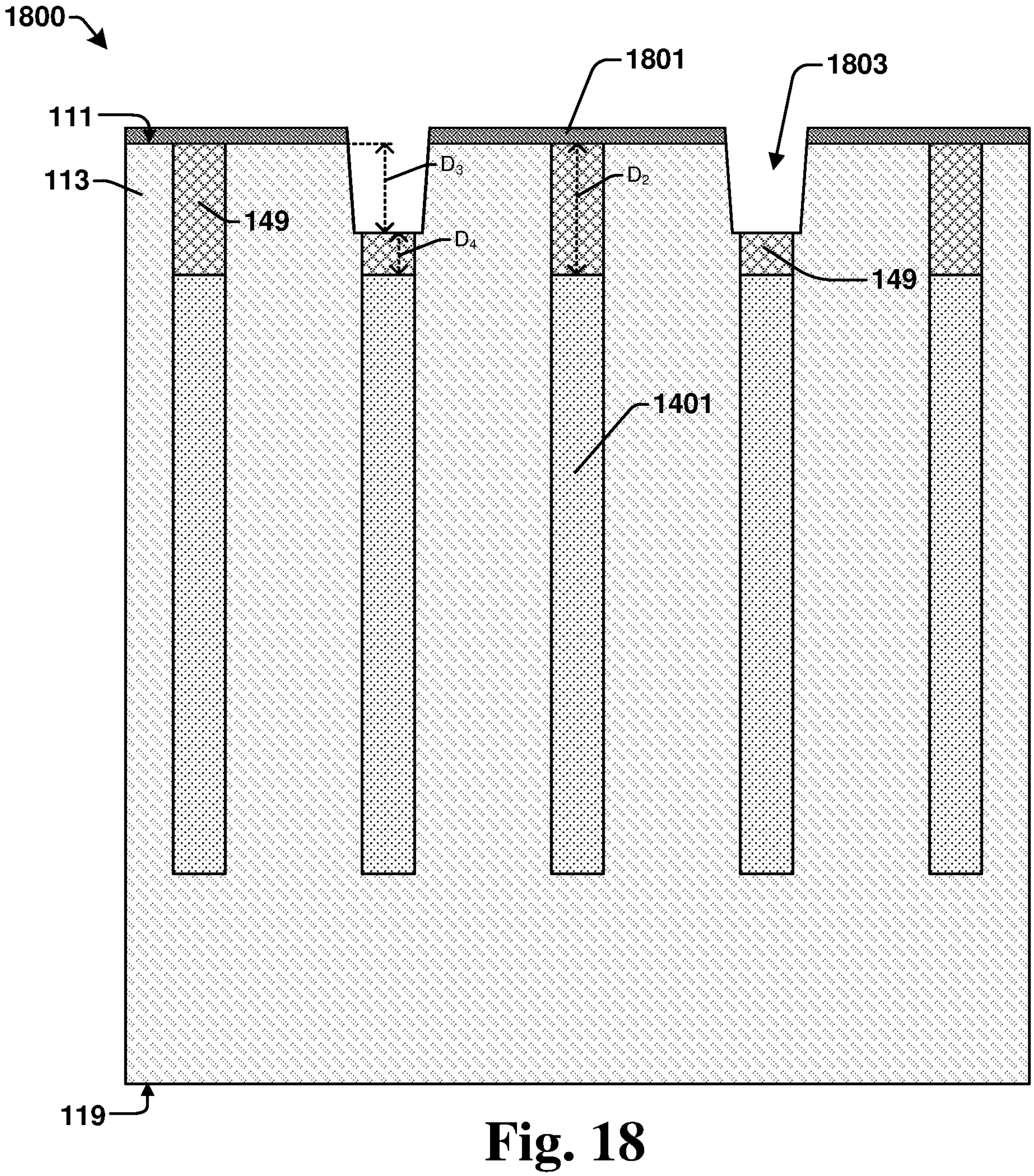

As illustrated by the cross-sectional view 1800 of FIG. 18, a mask 1801 is formed and used to etch holes 1803 in the front side 111. The holes 1803 are formed directly over the grid-shaped semiconductor structure 149. In some embodiments, the holes 1803 are wider than the grid-shaped semiconductor structure 149. The etch process may be a dry etch such as a plasma etch, the like, or any other suitable etch process. The holes 1803 are etched to a depth D3 below the front side 111. In some embodiments, the depth D3 is in the range from about 10 nm to about 60 nm. In some embodiments, the depth D3 is in the range from about 60 nm to about 500 nm. The depth D3 is less than the depth D2. In some embodiments, the depth D3 is about 75% or less the depth D2. The depth D3 is selected relative to the depth D2 so that the thickness D4 of the grid-shaped semiconductor structure 149 that remains between the holes 1803 and the sacrificial material 1401 is sufficient to provide an etch stop layer for the subsequent process that etches away the sacrificial material 1401. In some embodiments, the thickness D4 is in the range from about 10 nm to about 60 nm. In some embodiments, the thickness D4 is in the range from about 60 nm to about 300 nm.

Figure 19:
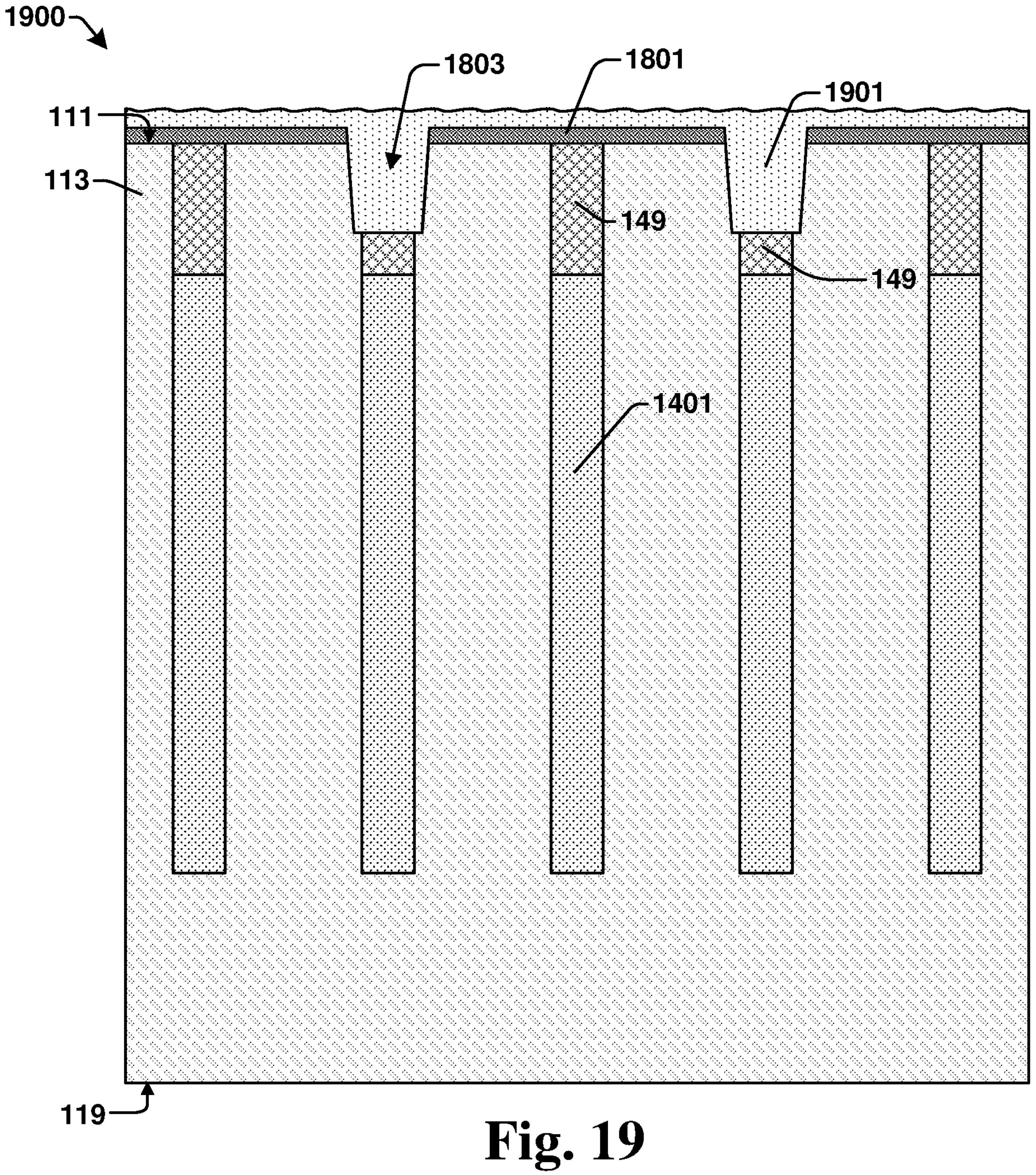

As illustrated by the cross-sectional view 1900 of FIG. 19, a dielectric 1901 is deposited so as to fill the holes 1803. In some embodiments, the dielectric 1901 is an oxide or the like. In some embodiments, the dielectric 1901 is silicon dioxide ($SiO_2$) or the like. The dielectric 1901 may be deposited by PVD, CVD, ALD, the like, or any other suitable process.

Figure 20:
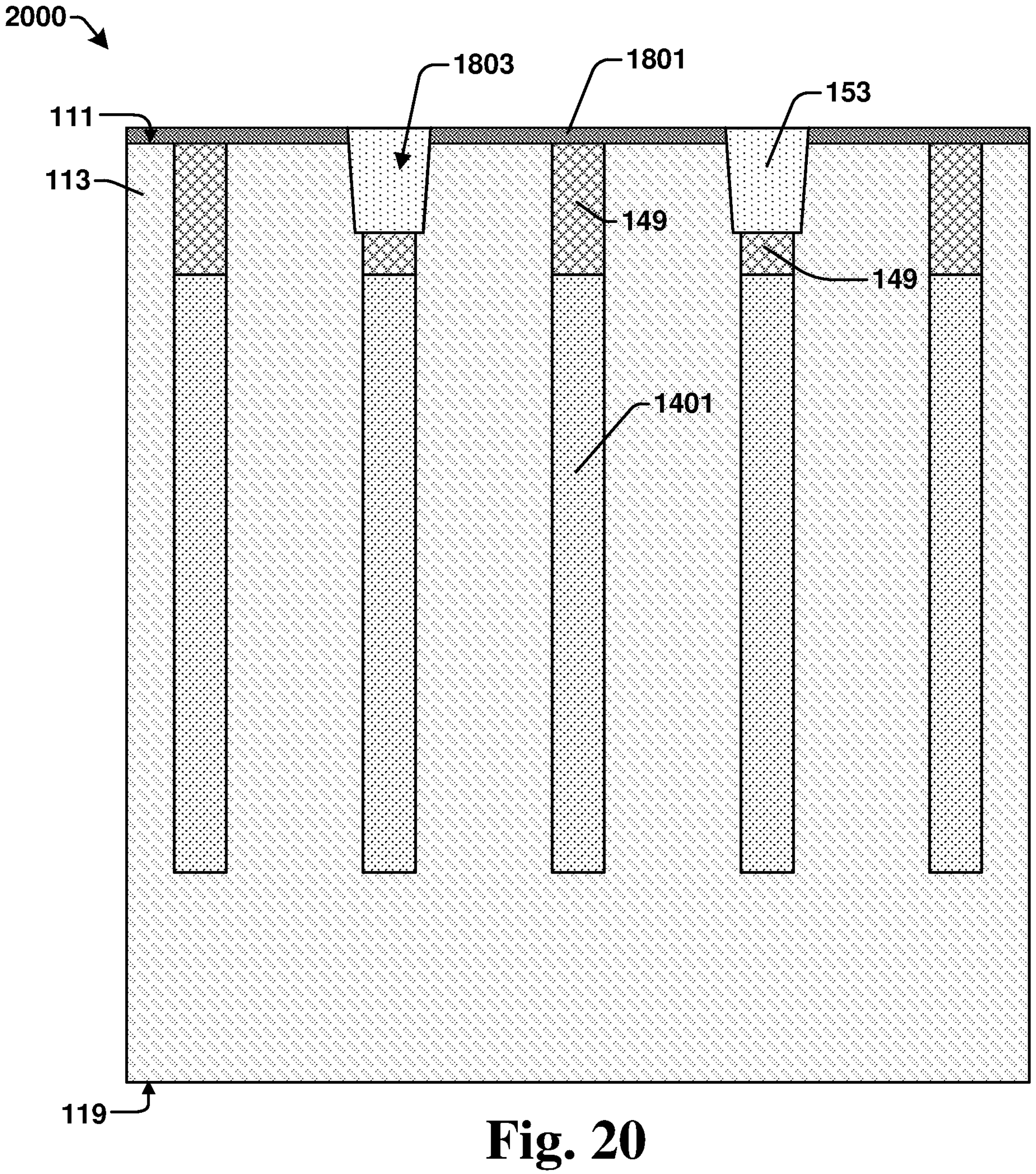

As illustrated by the cross-sectional view 2000 of FIG. 20, planarization process may be carried out. The planarization process may be CMP or the like. In some embodiments, the planarization process stops on the mask 1801. In some embodiments, the planarization process stops on the front side 111. The remaining dielectric 1901, which is within the holes 1803, forms the dielectric islands 153. The planarization process improves the uniformity of the recess process of the following step.

Figure 21:
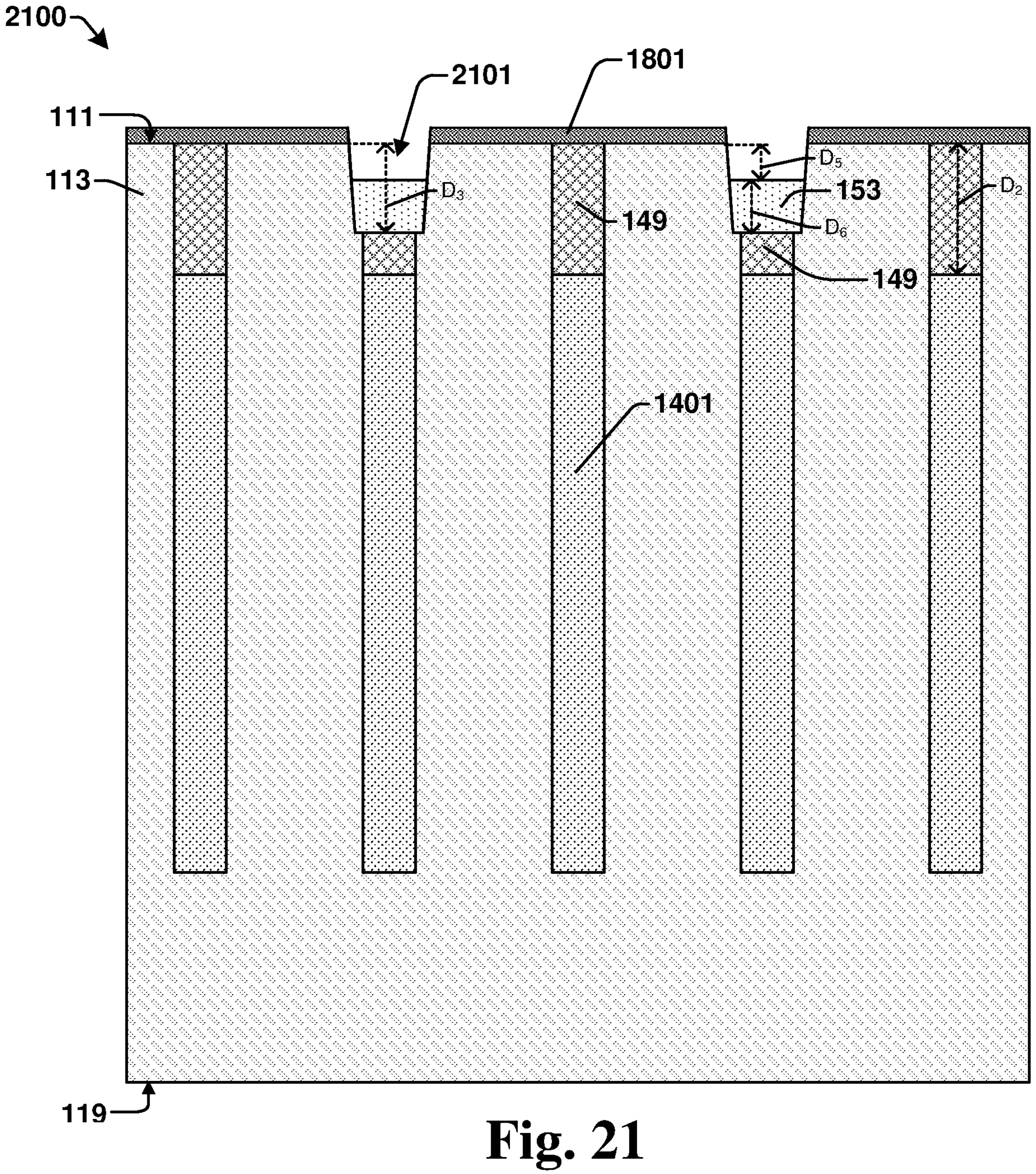

As illustrated by the cross-sectional view 2100 of FIG. 21, the dielectric islands 153 are etched so that the dielectric islands 153 are recessed below the front side 111 and holes 2101 are created directly above the dielectric islands 153. The etch process may be a wet etch, a dry etch, or the like. The holes 2101 are as wide as the dielectric islands 153 or are slightly wider. The etch process may thin or remove the mask 1801. The holes 2102 are etched to a depth D5 below the front side 111 leaving the dielectric islands 153 with a thickness D5. In some embodiments, the depth D5 is in the range from about 1 nm to about 20 nm. In some embodiments, the depth D5 is in the range from about 20 nm to about 200 nm. In some embodiments, the depth D5 is about half or less the depth D2. The depth D5 may be selected in relation to a desired thickness of the semiconductor that will subsequently fill the holes 2102, which in turn may relate to such factors as a desired capacitance for the floating diffusion regions 205 (see FIGS. 1 and 2). In some embodiments, the thickness D6 is in the range from about 10 nm to about 60 nm. In some embodiments, the depth D6 is in the range from about 60 nm to about 300 nm. The thickness D5 is selected so that the dielectric islands 153 will have sufficient thickness to limit leakage currents between the floating diffusion regions 205 and the grid-shaped semiconductor structure 149.

Figure 22:
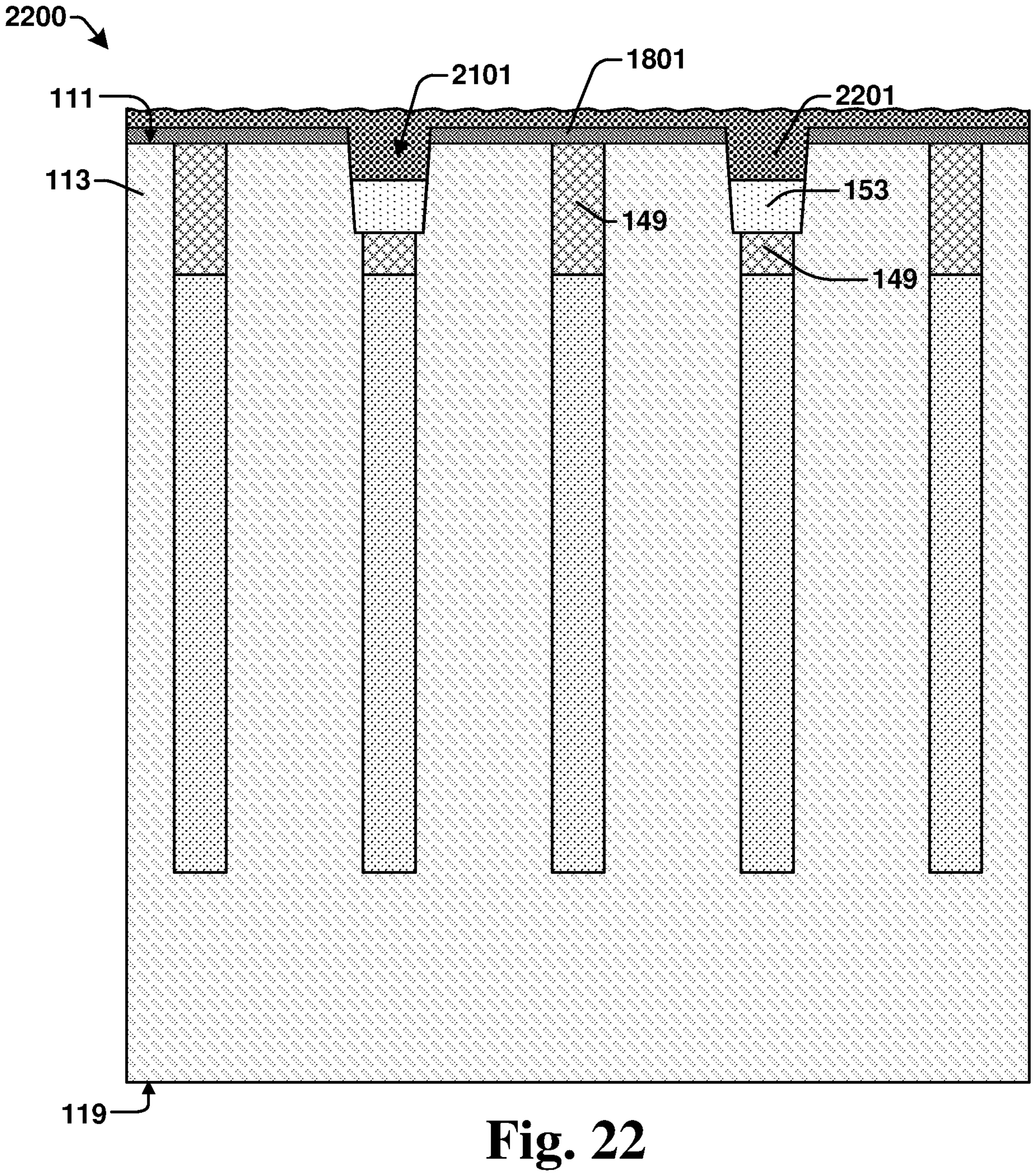

As illustrated by the cross-sectional view 2200 of FIG. 22, the process may continue by filling the holes 2101 with semiconductor 2201. In some embodiments, the semiconductor 2201 is polysilicon or the like. The semiconductor 2201 may be deposited by PVD, CVD, ALD, the like, or any other suitable process. In some embodiments, the semiconductor 1601 is formed by epitaxial growth. In some embodiments, the semiconductor 2201 has n-type doping. N-type doping in the semiconductor 2201 can provide PN junction isolation between the semiconductor 2201 and adjacent semiconductors such as the semiconductor body 113 and the grid-shaped semiconductor structure 149.

Figure 23:
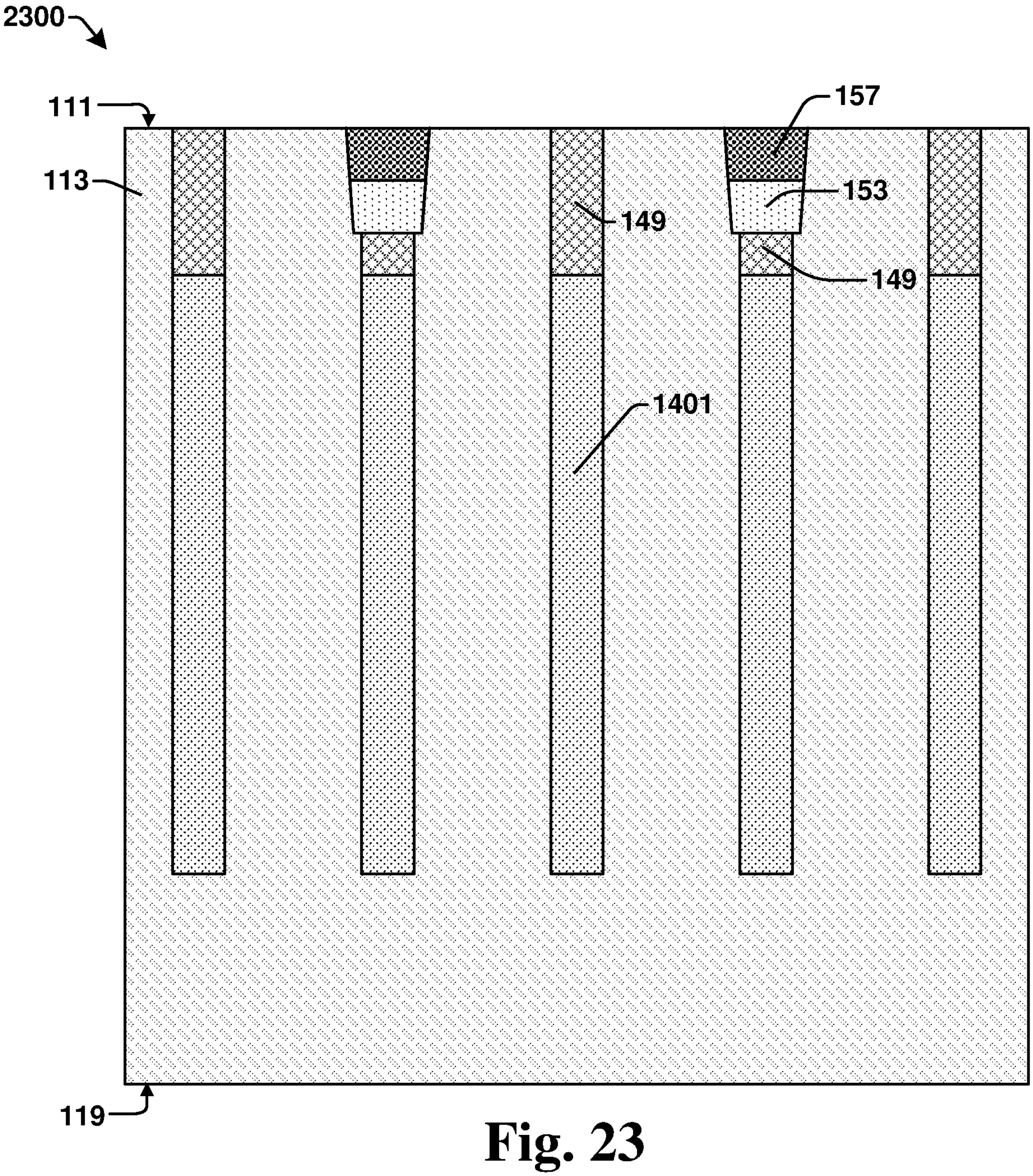

As illustrated by the cross-sectional view 2300 of FIG. 23, excess semiconductor 2201 is removed from the front side 111. The remaining semiconductor 2201 forms the semiconductor islands 157. In some embodiments, the removal process is an etch process. In some embodiments, the removal process is a planarization process. The planarization process may be, for example, CMP or the like. The etch or CMP process may stop on the mask 1801. In some embodiments, the etch or CMP process removes the mask 1801. In some embodiments, the etch or CMP process stops on the front side 111.

Figure 24:
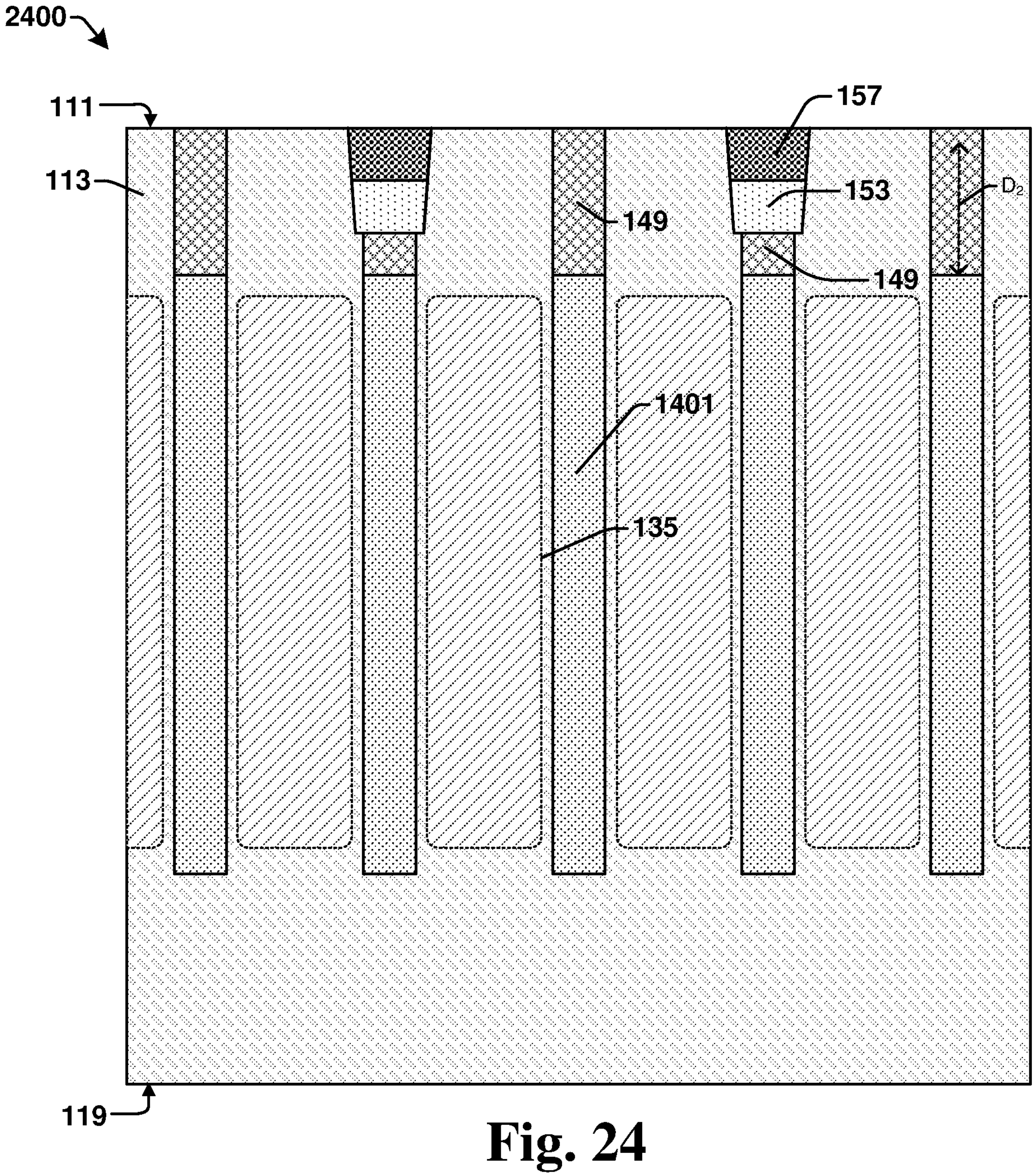

As illustrated by the cross-sectional view 2400 of FIG. 24, ion implantations may be carried out to form photodiodes 135. The ion implantation may include, for example, a deep n-well implant, a shallow p-well implant, and the like. Some of these ion implantations may be carried out with masks. In some embodiments, these ion implantations form a p-well having a depth greater than or equal to the depth D2. A p-well of this depth may provide junction isolation for the grid-shaped semiconductor structure 149.

Figure 25:
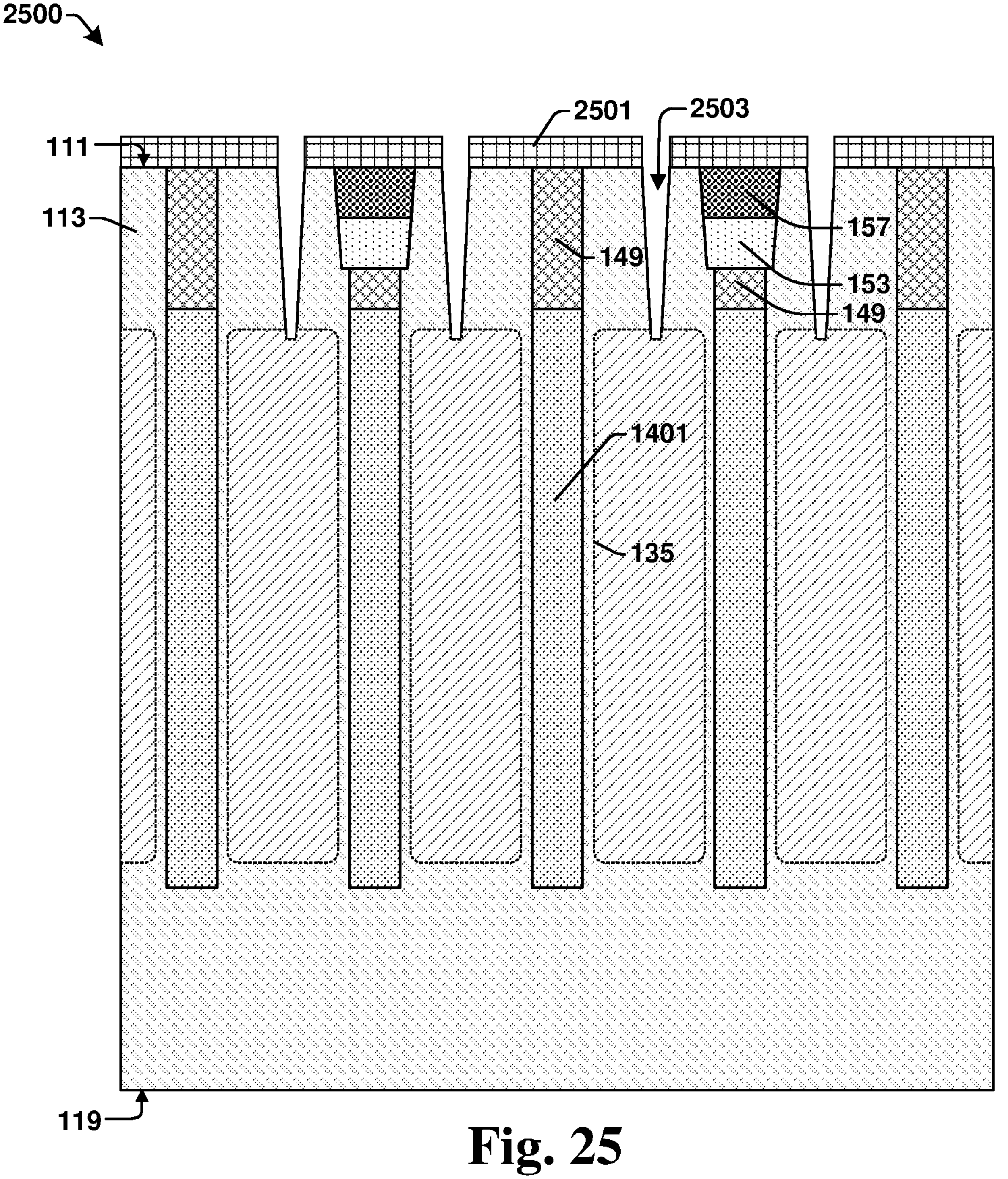

As illustrated by the cross-sectional view 2500 of FIG. 25, a mask 2501 may be formed and used to etch holes 2503. As illustrated by the cross-sectional view 2600 of FIG. 26, the mask 2501 may be stripped and a gate stack 2605 may then be formed. The gate stack 2605 may include a gate dielectric layer 2601 and a gate electrode layer 2603. The gate stack 2605 fills the holes 2503. The gate dielectric layer 2601 may be an oxide, the like, or some other material suitable for a gate dielectric layer. The gate electrode layer 2603 may be polysilicon, the like, or some other suitable material. These layers may be deposited by PVD, CVD, ALD, the like, or any other suitable process.

Figure 27:
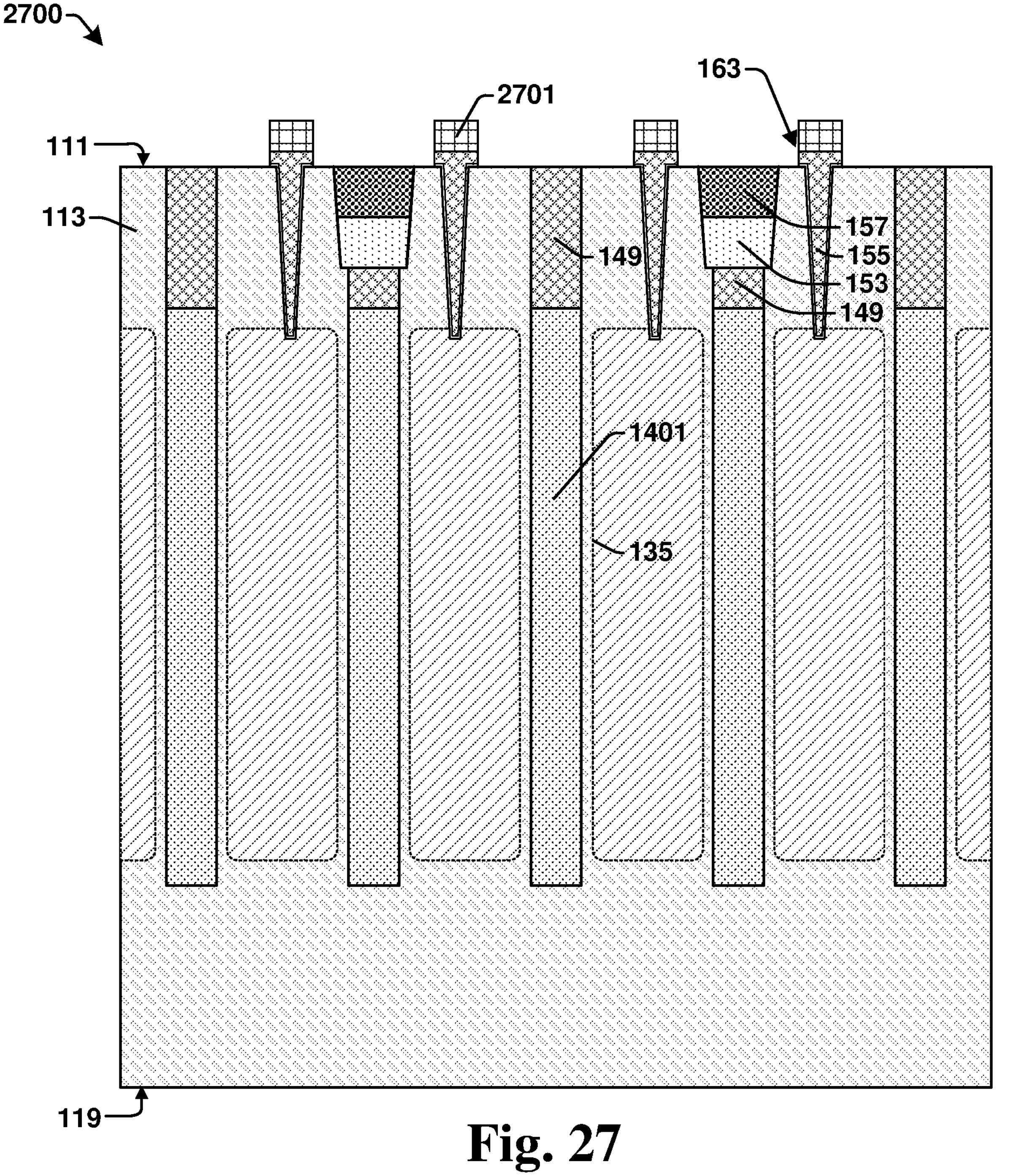

As shown by the cross-sectional view 2700 of FIG. 27, a mask 2701 may be formed and used to pattern transfer gates 163 comprising transfer gate electrodes 155 from the gate stack 2605. Other transistors may also be defined from the gate stack 2605 by this patterning process.

Figure 28:
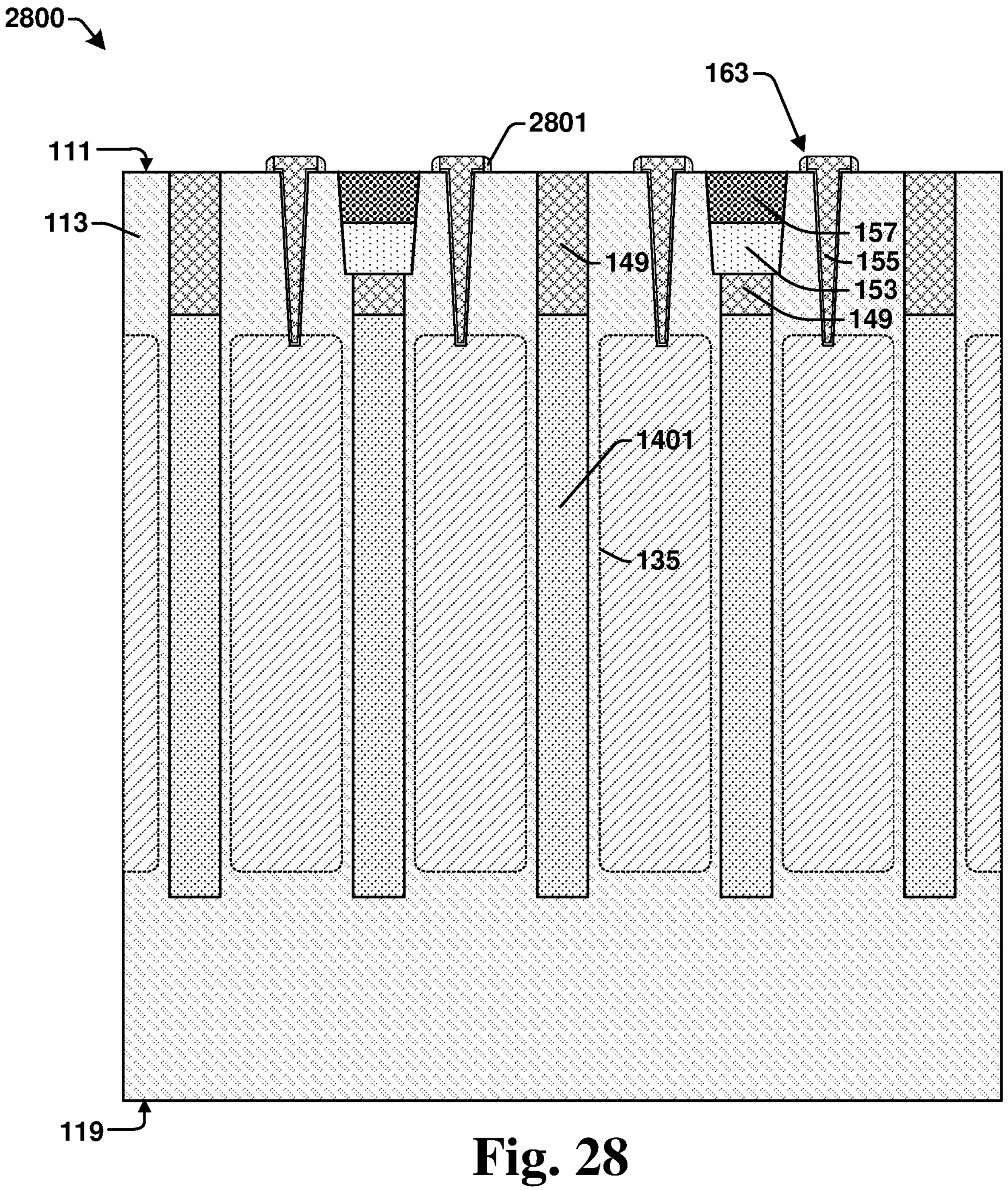

As shown by the cross-sectional view 2800 of FIG. 28, spacers 2801 may be formed around the transfer gates 163. The spacer 2801 may be formed by depositing a spacer material followed by anisotropic etching. The spacer material may include one or more layers of any suitable dielectrics. The spacer material may be or comprise, for example, silicon nitride (SiN), silicon oxynitride (SiON), silicon dioxide ($SiO_2$), a high-κ dielectric, or the like. The spacer material may be deposited by ALD, CVD, PVD, the like, or any other suitable process.

Figure 29:
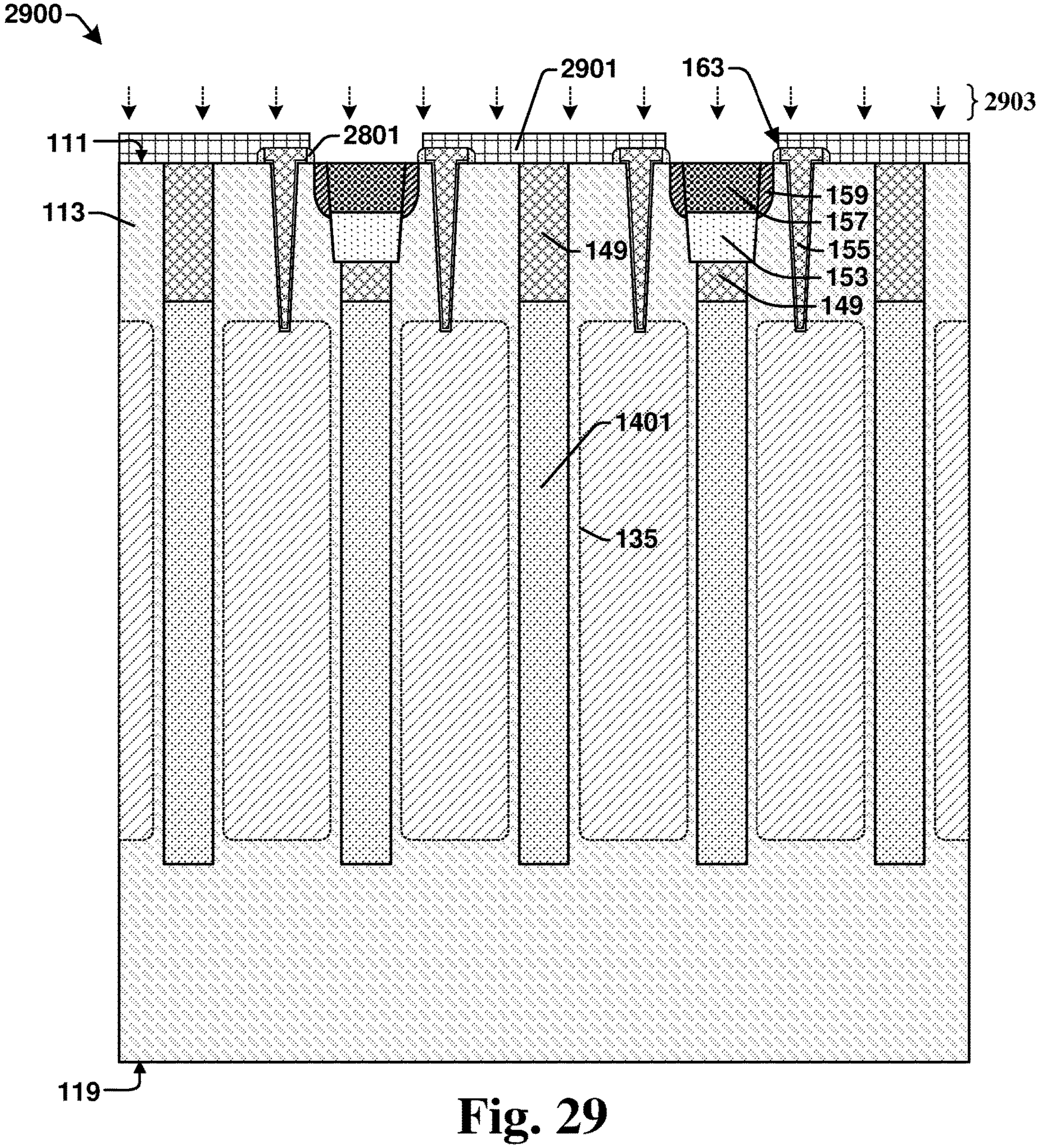

As shown by the cross-sectional view 2900 of FIG. 29, a mask 2901 is formed and ions 2903 are implanted to form N-wells 159. The N-wells 159 may be aligned to the spacers 2801. In some embodiments, the ion implantation process also imparts n-type doping to the semiconductor islands 157. The ion implantation process may also create n-doped areas 207 (see FIGS. 2 and 3) in portions of the grid-shaped semiconductor structure 149 that abut the semiconductor islands 157.

Figure 30:
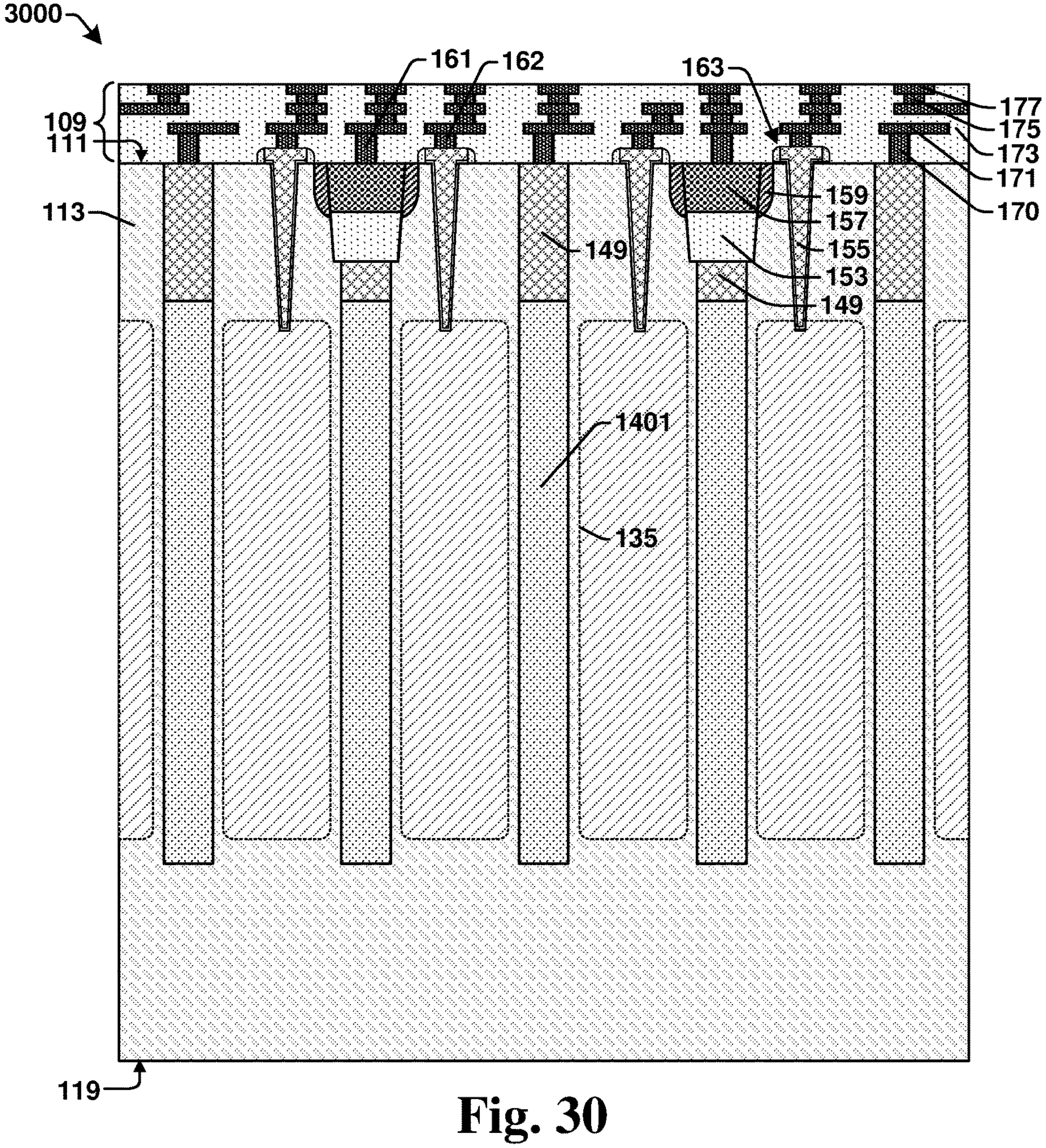

As shown by the cross-sectional view 3000 of FIG. 30, the process may continue with formation of the metal interconnect structure 109 over the front side 111. In some embodiments, the metal interconnect structure 109 is formed using damascene or dual damascene processes. The wires 171, the vias 175 may include one or more layers of copper (Cu), tungsten (W), ruthenium (Ru), palladium (Pd), platinum (Pt), cobalt (Co), nickel (Ni), zirconium (Zr), titanium (Ti), tantalum (Ta), aluminum (Al), conductive carbides, oxides, alloys of these metals, the like, or any other suitable conductive materials. One of the layers may be a diffusion barrier layer such as titanium (Ti), tantalum (Ta), titanium nitride (TiN), tantalum nitride (TaN), or the like. The bonding pads 177 may be one of these compositions or a different composition. Likewise contacts 161, 162, and 170 may be one of these compositions or a different composition. In some embodiments, the contacts 161, 162, and 170 are tungsten (W), cobalt (Co), cobalt silicide (CoSi2), nickel (Ni), nickel silicide (NiSi), an alloy thereof, or the like. These materials may be deposited by electroplating, electroless plating, ALD, CVD, PVD, the like, or any other suitable process.

The interlevel dielectric 173 may include one or more layers of silicon dioxide ($SiO_2$), a low-κ interlevel dielectric, or an extremely low-κ dielectric. A low-κ dielectric is one having a smaller dielectric constant than silicon dioxide ($SiO_2$). $SiO_2$ has a dielectric constant of about 3.9. Examples of low-κ dielectrics include organosilicate glasses (OSG) such as carbon-doped silicon dioxide, fluorine-doped silicon dioxide (otherwise referred to as fluorinated silica glass (FSG), organic polymer low low-κ dielectrics, and porous silicate glass. An extremely low-κ dielectric is a material having a dielectric constant of about 2.1 or less. An extremely low-κ dielectric material is generally a low-κ dielectric material formed into a porous structure. Porosity reduces the effective dielectric constant. The low-κ interlevel dielectric 173 may be deposited by ALD, CVD, PVD, the like, or any other suitable processes. The semiconductor body 113 and the metal interconnect structure 109 comprise the first chip 168.

Figure 31:
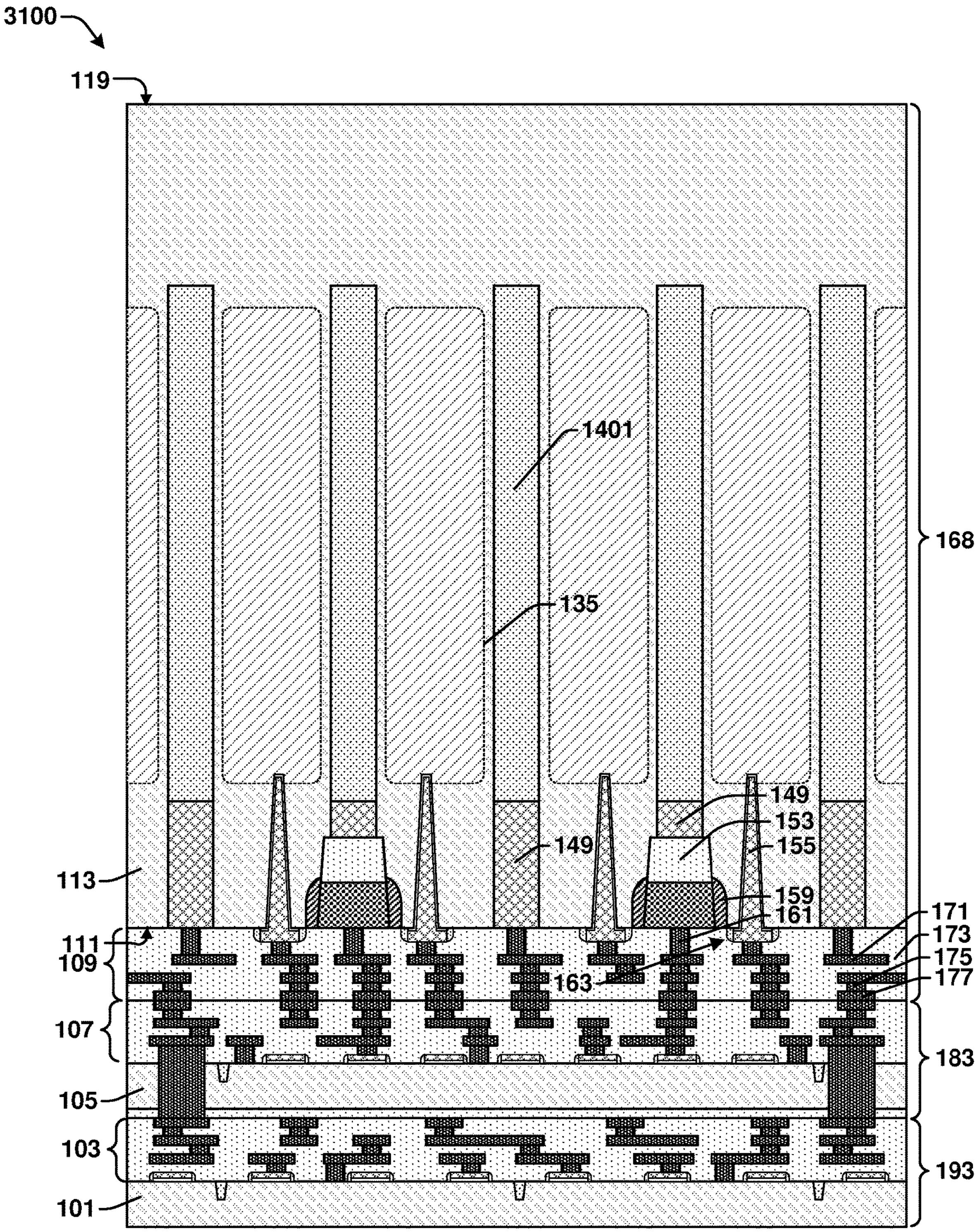

As shown by the cross-sectional view 3100 of FIG. 31, the first chip 168 may be inverted and bonded to the second chip 183. The bonding process may be oxide-to-oxide bonding, metallic bonding, a combination thereof, the like, or any other suitable bonding process. The second chip 183 may be bonded to the third chip 193 either before or after bonding to the first chip 168.

Figure 32:
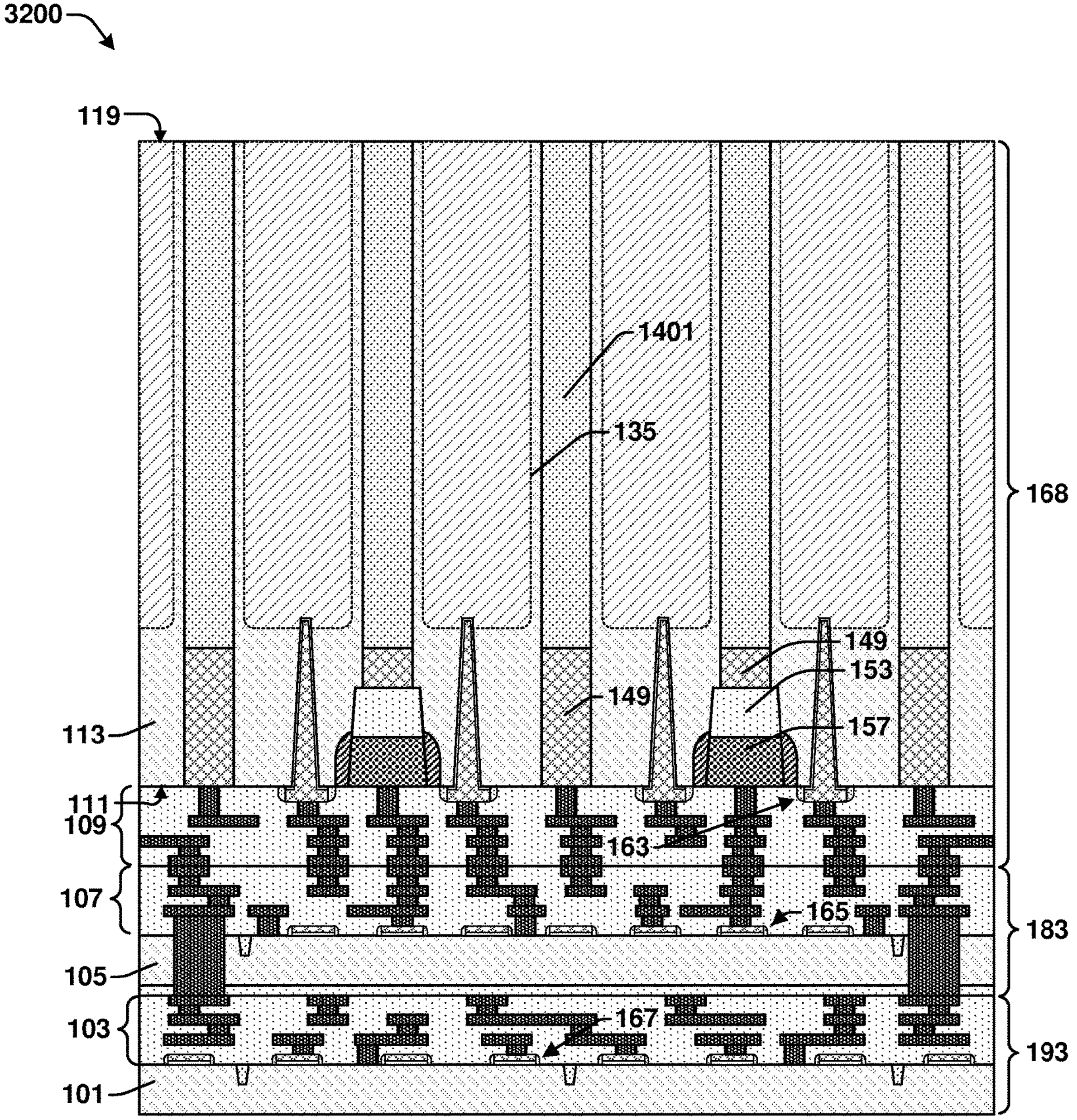

As shown by the cross-sectional view 3200 of FIG. 32, after bonding, the semiconductor body 113 may be thinned from the back side 119. Thinning the semiconductor body 113 allows light to pass more easily to the photodiodes 135. The semiconductor body 113 may be thinned by etching, mechanical grinding, CMP, the like, or any other suitable process. In some embodiments, the semiconductor body 113 is thinned to a thickness in the range from about 7 μm to about 3 μm. In some embodiments, the semiconductor body 113 is thinned to a thickness in the range from about 1 μm to about 3 μm. The thinning process proceeds at least to a point where the sacrificial material 1401 is exposed on the back side 119.

Figure 33:
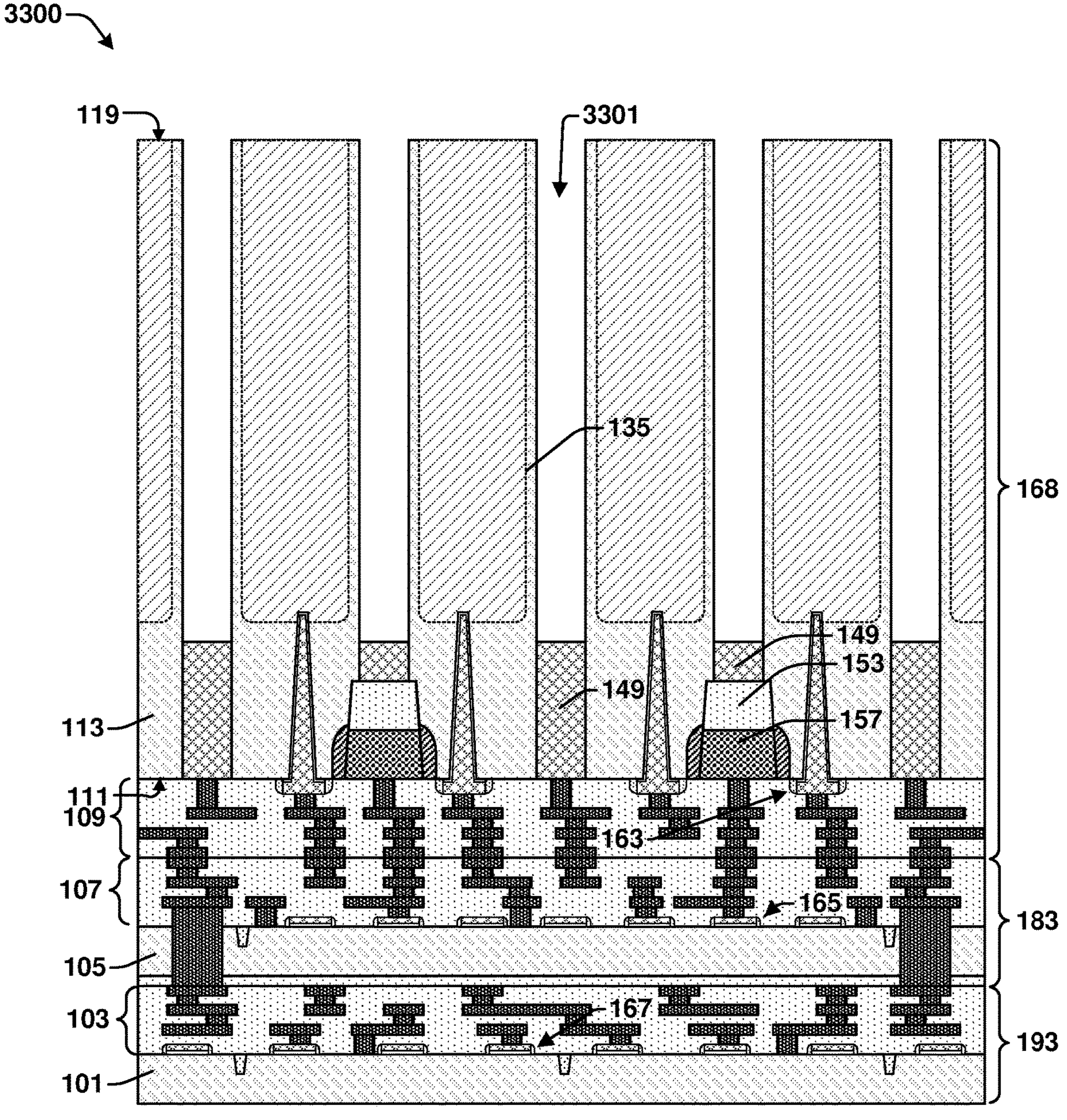

As shown by the cross-sectional view 3300 of FIG. 33, an etch process is carried out to remove the sacrificial material 1401 leaving trenches 3301. In accordance with some embodiments, the etch process stops on the grid-shaped semiconductor structure 149. The etch process may be a dry etch, a wet etch, the like, or any other suitable etch process.

Figure 34:
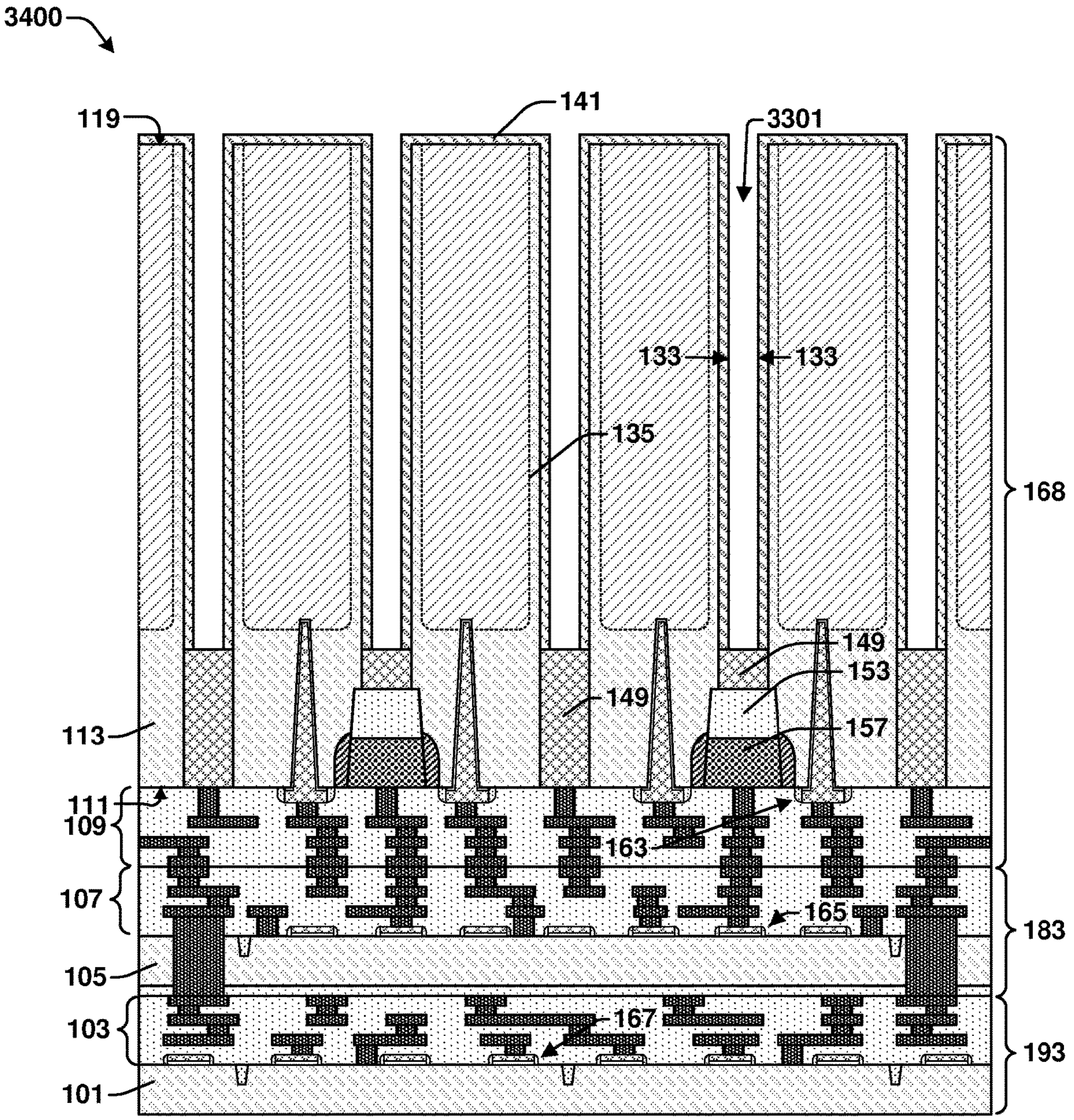

As shown by the cross-sectional view 3400 of FIG. 34, the epitaxial layer 141, which comprises semiconductor, may be grown on the sidewalls of the trenches 3301. The back side 119 may be masked or the epitaxial layer 141 may be allowed to grow on the back side 119. The epitaxial layer 141 adds to the internal sidewalls 133, narrows the trenches 3301, and may passivate defects on the internal sidewalls 133. In some embodiments, the epitaxial layer 141 has p-type doping.

Figure 35:
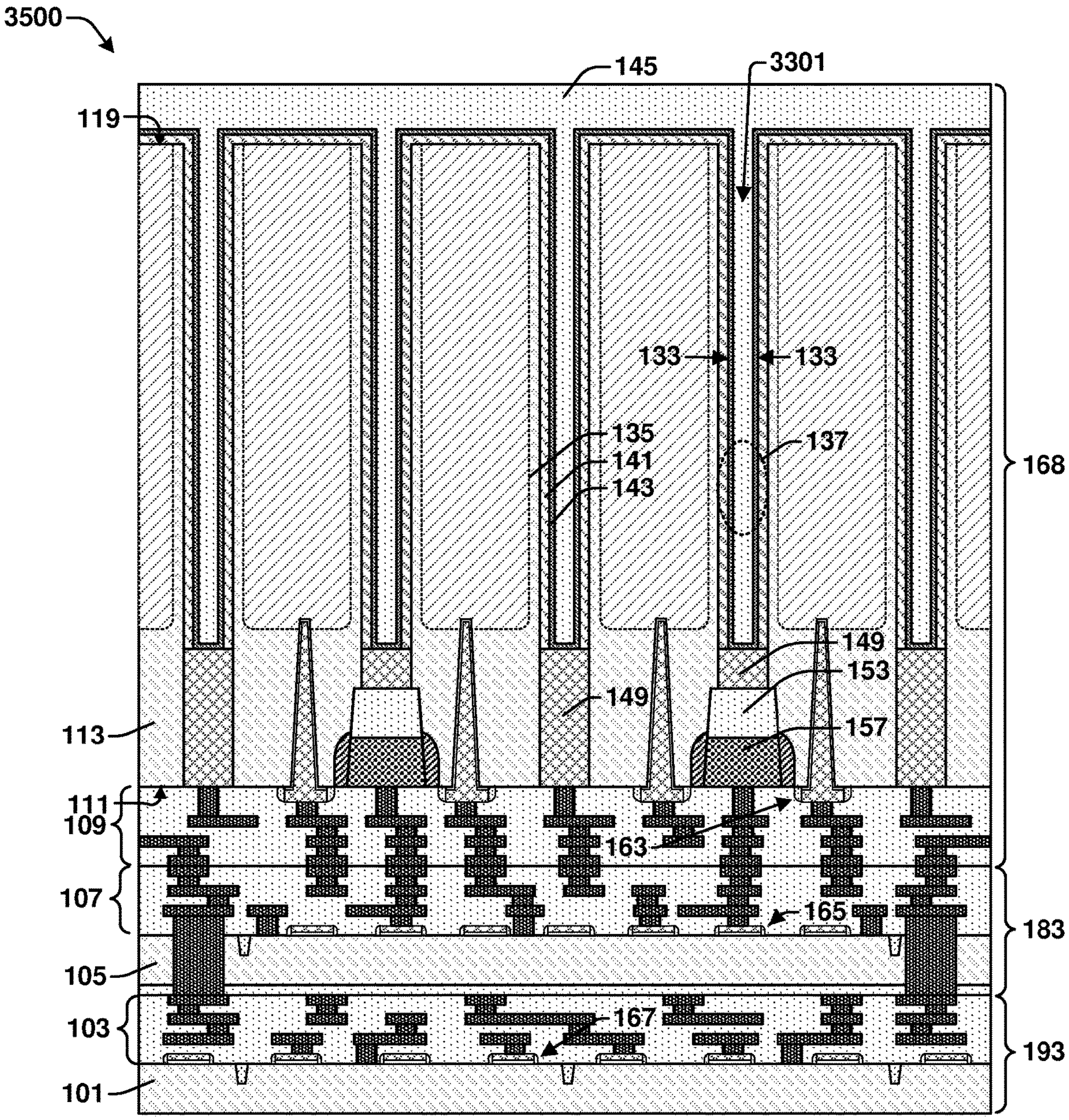

As shown by the cross-sectional view 3500 of FIG. 35, the trenches 3301 may be lined with the high-κ dielectric layer 143, after which the trenches 3301 are filled to provide the dielectric core 145. The high-κ dielectric layer 143 may be, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium oxide aluminum oxide ($HfO_2$—$Al_2O_3$), zirconium oxide ($ZrO_2$), tantalum oxide ($Ta_2O_5$), aluminum oxide ($Al_2O_3$), yttrium oxide ($Y_2O_3$), lanthanum oxide ($La_2O_3$), strontium titanium oxide ($SrTiO_3$), or the like and may have a thickness in the range from 5 to 50 Angstroms, for example. The high-κ dielectric layer 143 may be deposited by ALD, CVD, PVD, the like, or any suitable process. The dielectric core 145 may be an oxide such as silicon oxide ($SiO_2$), tantalum oxide ($Ta_2O_5$), or the like and may be deposited by ALD, CVD, PVD, the like, or any suitable process. Additional processing may be carried out to provide a back side metal grid 125, color filters 123, and microlenses 121 so as to provide a structure such as the IC device 100 of FIG. 1.

Figure 36:
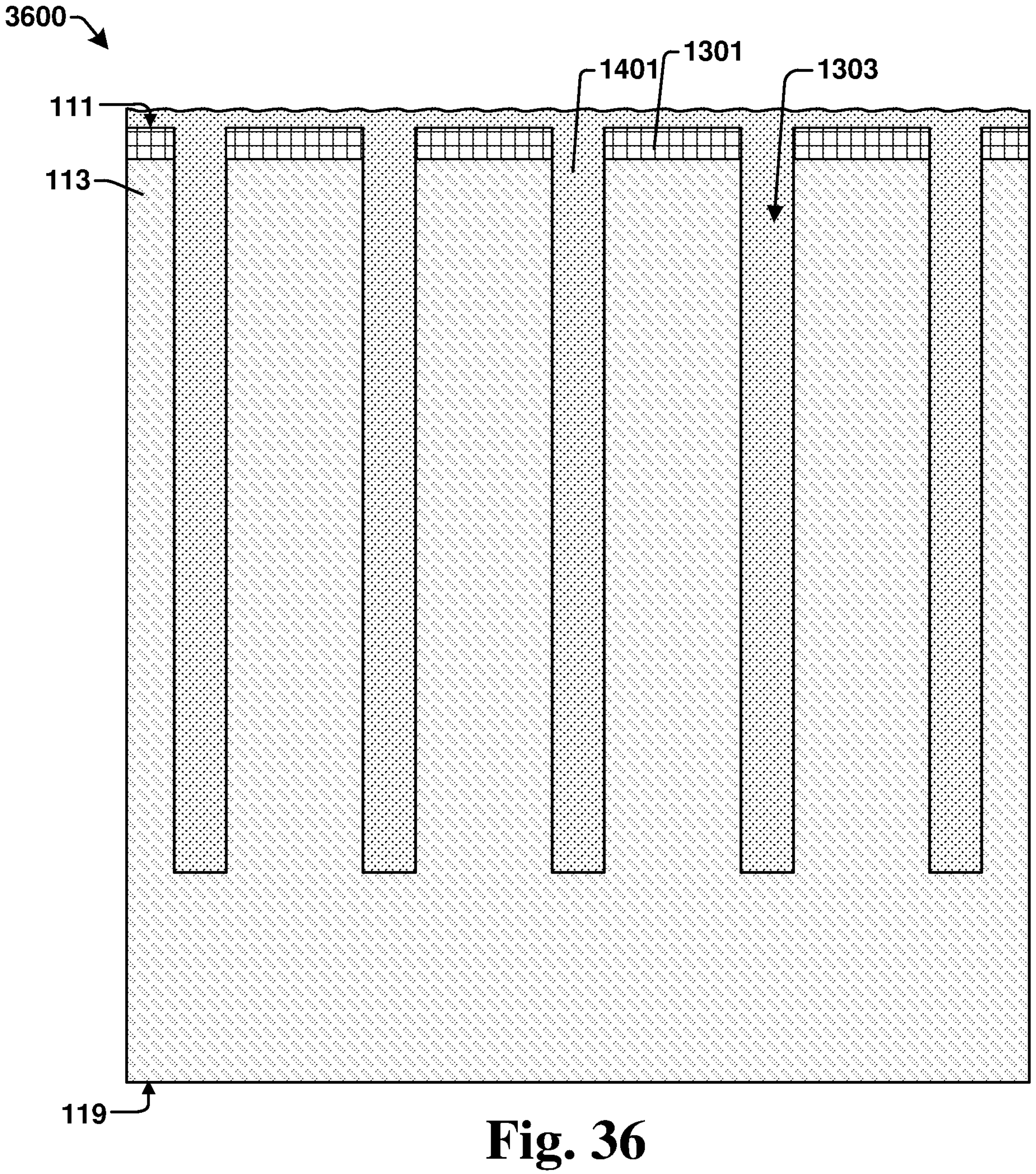
FIGS. 36-38 provide a series of cross-sectional views illustrating a variation of the process of FIGS. 13-35.
Figure 37:
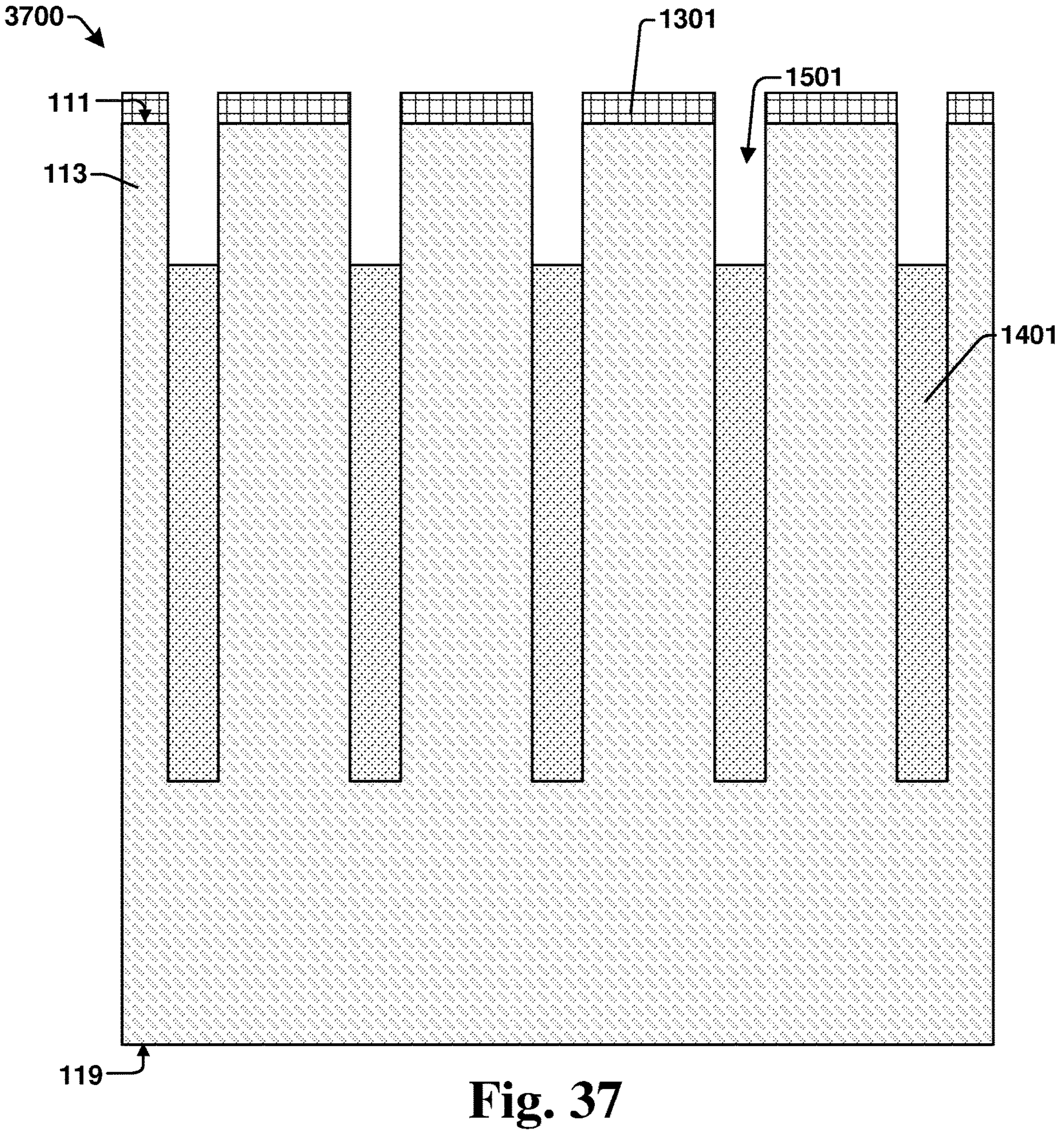
Figure 38:
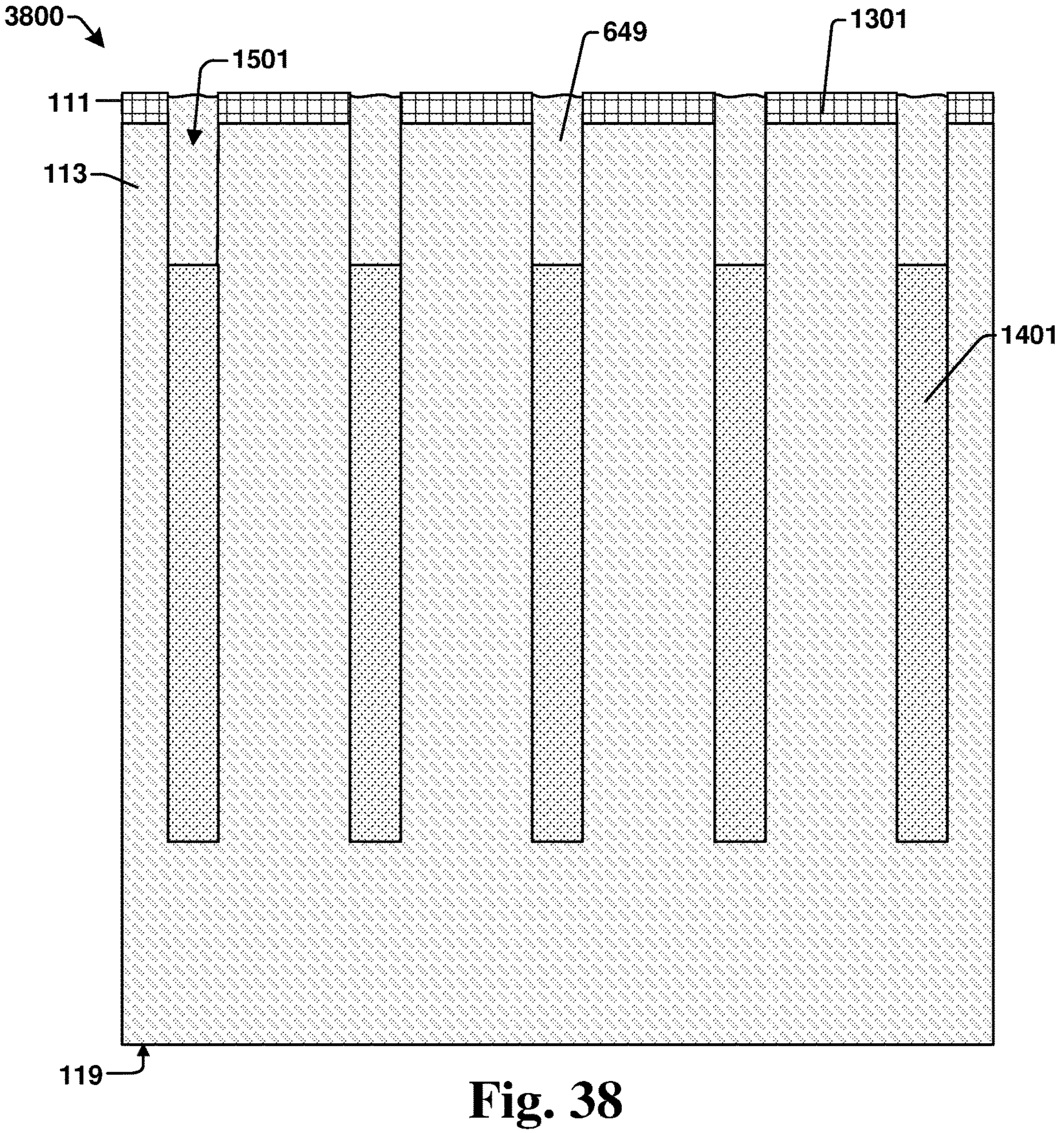

FIGS. 36-38 illustrate a variation of the foregoing process. As shown by the cross-sectional view 3600 of FIG. 36, which may be compared to the cross-sectional view 1400 of FIG. 14, in this variation the mask 1301 remains in place while the trenches 1303 are filled with the sacrificial material 1401. As shown by the cross-sectional view 3700 of FIG. 37, at least a layer of the mask 1301 may remain in place after the processing that results in the sacrificial material 1401 being recessed below the front side 111. As shown by the cross-sectional view 3800 of FIG. 38, the trenches 1501 are filled with semiconductor by an epitaxial growth process so as to form the grid-shaped semiconductor structure 649. In some embodiments, the grid-shaped semiconductor structure 649 is the same type of semiconductor as the semiconductor body 113. In some embodiments, the grid-shaped semiconductor structure 649 is silicon (Si) or the like. In some embodiments, the grid-shaped semiconductor structure 649 has p-type doping. P-type doping in the grid-shaped semiconductor structure 649 can improve isolation between photodiode pixels.

Figure 39:
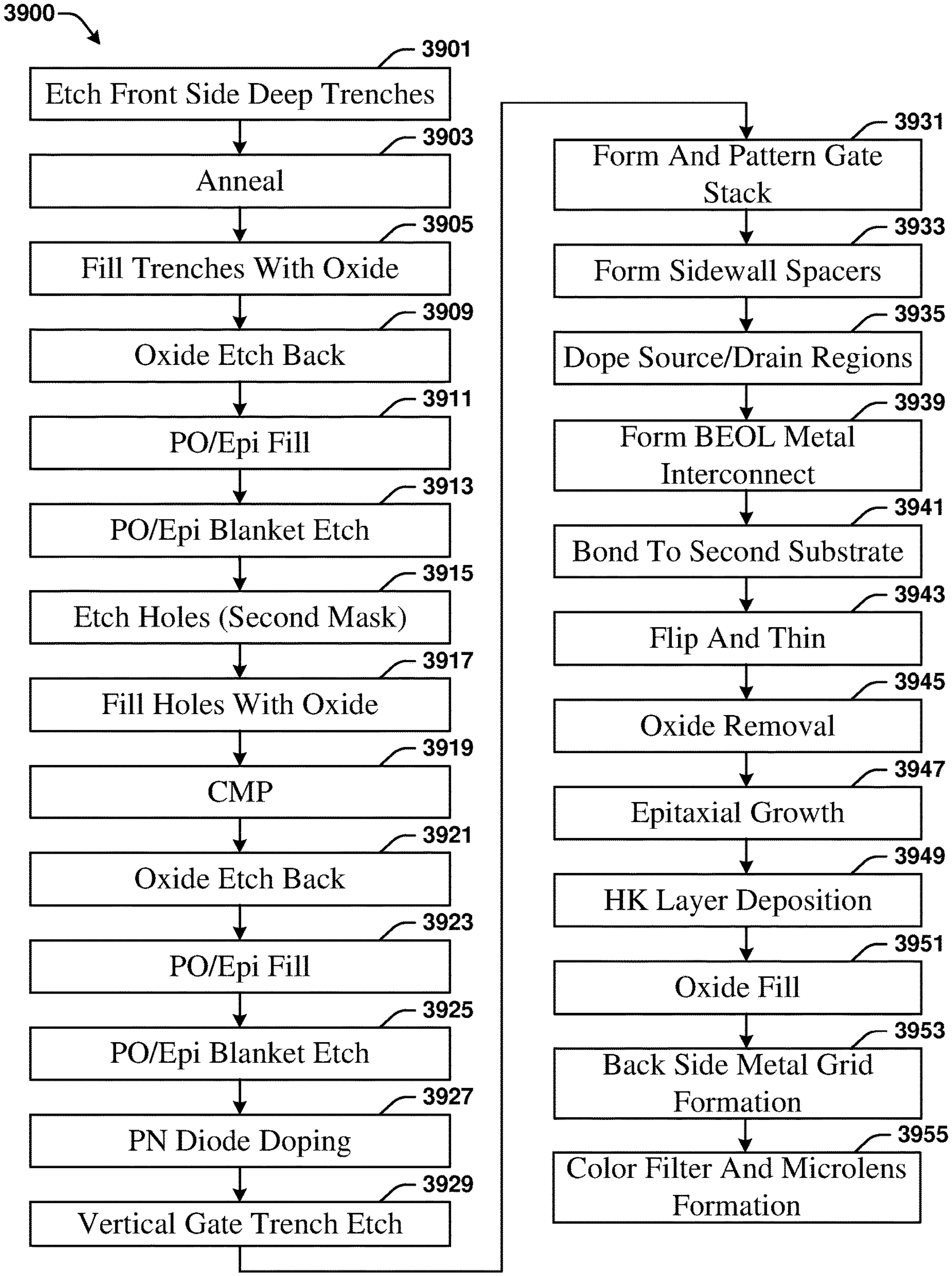
FIG. 39 provides a flow chart of a process according to some embodiments.

FIG. 39 provides a flow diagram for a process 3900 of forming an image sensing device according to some embodiments. While the process 3900 is illustrated and described below as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The process 3900 may begin with act 3901, etching deep trenches in the front side of a semiconductor body. The cross-sectional view 1300 of FIG. 13 provides an example. The trenches are in the pattern of a grid defined by a hard mask. The etching may be carried out with high energy plasma so that the trenches can be narrow with steep sidewalls.

Act 3903 is annealing. This annealing process repairs etch damage from the trench formation process. The annealing process may be carried this stage of processing or at some later stage prior to act 3927, which is doping to form photodiodes.

Act 3905 is filling the trenches with an oxide or some other sacrificial material. The cross-sectional views 1400 of FIGS. 14 and 3600 of FIG. 36 provide examples.

Act 3909 is an etch process that causes the oxide or other sacrificial material that was used to fill the trenches to become recessed within the trenches. The cross-sectional views 1500 of FIGS. 15 and 3700 of FIG. 37 provide examples.

Act 3911 is a deposition process that causes the recesses created by the etch back of act 3909 to be filled so as to create a grid-shaped semiconductor structure. The cross-sectional views 1600 of FIGS. 16 and 3800 of FIG. 38 provide examples.

Act 3913 is an etch back and/or planarization process that removes excess semiconductor material from the front side surface. The cross-sectional view 1700 of FIG. 17 provides an example. Any remaining portion of the hard mask which was used in the deep trench etch of act 3901 may be removed at this stage of processing.

Act 3915 is forming a second mask and etching holes through the mask. The holes are located directly over the grid-shaped semiconductor structure so that the holes penetrate into the grid-shaped semiconductor structure. In some embodiments, the holes are formed at crossroads of the grid-shaped semiconductor structure. In some embodiments, the holes are wider than the segments of the grid-shaped semiconductor structure. The cross-sectional view 1800 of FIG. 18 provides an example.

Act 3917 is filling the holes with a dielectric, such as an oxide. The cross-sectional view 1900 of FIG. 19 provides an example.

Act 3919 is a planarization process. The planarization process removes excess dielectric from the previous deposition step. The cross-sectional view 2000 of FIG. 20 provides an example.

Act 3921 is a dielectric etch back process which etches the dielectric deposited in act 3917 so as to create recesses corresponding to upper portions of the holes that were etched in the process of act 3915. The cross-sectional view 2100 of FIG. 21 provides an example.

Act 3923 is filling the recesses with semiconductor. In some embodiments, the semiconductor is polysilicon or some other semiconductor that can be deposited by PVD or CVD. In some embodiments, the semiconductor is epitaxially grown in the recesses. The cross-sectional view 2200 of FIG. 22 provides an example.

Act 3925 is an etch back and/or planarization process that removes excess semiconductor material from the front side surface. The remaining semiconductor deposited in the previous step forms semiconductor islands. The cross-sectional view 2300 of FIG. 23 provides an example.

Act 3927 comprises one or more ion implantation processes which form PN diodes laterally separated by the grid-shaped isolation structure formed in the previous steps. The ion implantation processes include at least one deep n-well implantation. In some embodiments, the ion implantation processes include a shallow p-well implant. The cross-sectional view 2400 of FIG. 24 provides an example.

Act 3929 is etching trenches for vertical transfer gate electrodes. The cross-sectional view 2500 of FIG. 25 provides an example.

Figure 26:
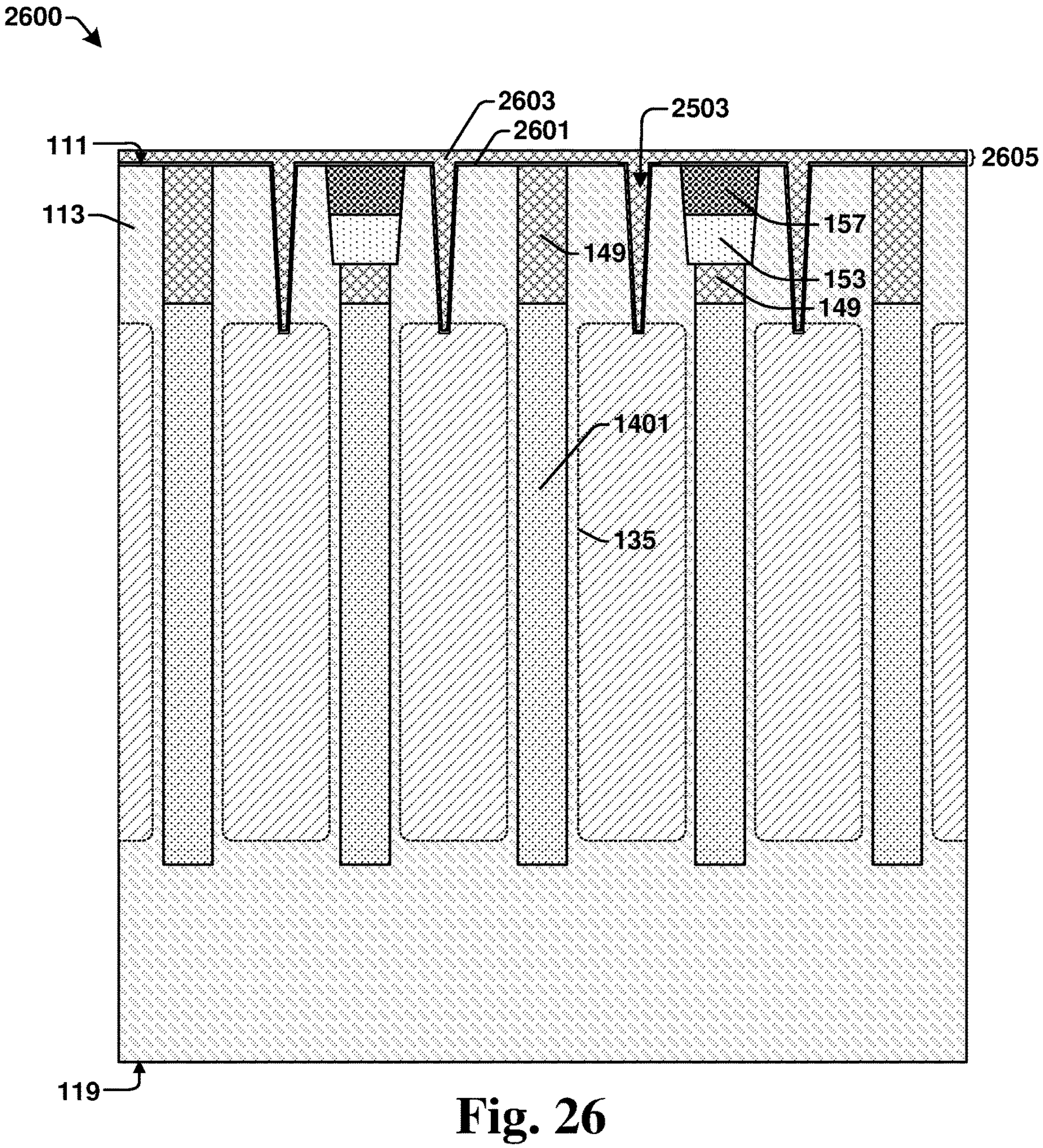

Act 3931 is depositing and patterning a gate stack. The gate stack deposits in the trenches formed in the previous step. The cross-sectional view 2600 of FIG. 26 provides an example illustrating the formation of the gate stack. The cross-sectional view 2700 of FIG. 27 provides an example illustrating the patterning of the gate stack.

Act 3933 is forming sidewall spacers around the gates. The cross-sectional view 2800 of FIG. 28 provides an example.

Act 3935 is implanting source/drain regions around the gates. Optionally this implantation provides n-type doping to the semiconductor islands. Optionally, this doping extends into potions of the grid-shaped semiconductor structure that border the semiconductor islands. The cross-sectional view 2900 of FIG. 29 provides an example.

Act 3939 is BEOL processing which forms a metal interconnect structure over the front side. The metal interconnect structure has contacts with the semiconductor islands and with the gate electrodes from act 3931. In some embodiments, the metal interconnect structure has contacts with the grid-shaped semiconductor structure, which contacts may be used to provide a ground or bias voltage. The cross-sectional view 3000 of FIG. 30 provides an example.

Act 3941 is bonding to one or more second substrates. The cross-sectional view 3100 of FIG. 31 provides an example. Act 3943 is thinning the semiconductor body from the back side. Thinning exposes the oxide or other sacrificial material deposited in act 3905. The cross-sectional view 3200 of FIG. 32 provides an example.

Act 3945 is etching to remove the oxide or other sacrificial material from the trenches. The etch process stops of the grid-shaped semiconductor structure formed by act 3911. The cross-sectional view 3300 of FIG. 33 provides an example.

Act 3947 is an optional step of epitaxially growing a semiconductor layer on the sidewalls of the trenches. The epitaxial growth process may repair defects and may narrow the trenches. In some embodiments, the epitaxially grown semiconductor has p-type doping. The cross-sectional view 3400 of FIG. 34 provides an example.

Act 3949 is lining the trenches with a high-κ dielectric layer. Act 3951 is filling the trenches with a dielectric material such as an oxide. The cross-sectional view 3500 of FIG. 35 provides an example.

Act 3953 is forming a back side metal grid. The back side metal grid may have segments corresponding to the trench isolation structure formed in the previous steps. Act 3955 is forming color filters and microlenses. The IC device 100 of FIG. 1 provides an example of a resulting structure.

Some aspects of the present disclosure relate to an image sensing device comprising an array of light sensing elements within a semiconductor body having a first side and a second side. Internal sidewalls of the semiconductor body define a grid-shaped trench structure extending from the second side and between the light sensing elements in the array. A grid-shaped semiconductor structure is disposed between the light sensing elements in the array. The grid-shaped semiconductor structure is also between the grid-shaped trench structure and the first side. An island of semiconductor is between the grid-shaped semiconductor structure and the first side. The island of semiconductor is in direct contact with the semiconductor body. An island of dielectric between the island of semiconductor and the grid-shaped semiconductor structure.

Some aspects of the present disclosure relate to an image sensing device comprising an array of light sensing elements within a semiconductor body having a first side and a second side. A deep trench isolation structure extends between the light sensing elements in the array from the second side. A floating diffusion region is disposed in the semiconductor body proximate the first side and directly opposite the deep trench isolation structure. A semiconductor structure is directly between the deep trench isolation structure and the floating diffusion region. A dielectric island within the semiconductor body directly between the semiconductor structure and the floating diffusion region.

Some aspects of the present disclosure relate to a method of manufacturing an integrated circuit device. The method includes etching a grid of trenches in the first side of semiconductor body and depositing sacrificial material in the trenches. The sacrificial material is etched to create first trench recesses, which are filling with a first semiconductor material to form a first semiconductor structure. The semiconductor body is subsequently thinned and the sacrificial material etched away from the second side so as to create second trench recesses. The trenches are then lined and filled with dielectric from the second side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an integrated circuit device, the method comprising:

providing a semiconductor body having a first side and a second side opposite the first side;

etching trenches in the first side, wherein the trenches form a grid;

depositing sacrificial material in the trenches from the first side;

etching from the first side so as to recess the sacrificial material within the trenches and create first trench recesses, wherein the first trench recesses have a first depth;

forming a first semiconductor structure in the semiconductor body by depositing a first semiconductor material within the first trench recesses;

etching holes from the first side, wherein the holes extend part way through the first semiconductor structure and have a second depth;

depositing a first dielectric in the holes;

etching from the first side so as to recess the first dielectric within the holes and create hole recesses, which have a third depth;

depositing a second semiconductor material in the hole recesses;

thinning the semiconductor body from the second side;

etching the sacrificial material from the second side so as to create second trench recesses, wherein the second trench recesses extend from the second side to the first semiconductor structure; and depositing dielectric in the second trench recesses.

2. The method of claim 1, wherein depositing the second semiconductor material in the hole recesses comprises epitaxially growing the second semiconductor material within the hole recesses.

3. The method of claim 1, wherein the second semiconductor material is polysilicon and the third depth is half or less than the first depth.

4. The method of claim 1, further comprising doping to form an array of photodiodes that are laterally separated by the trenches, wherein doping to form the array of photodiodes comprises forming P-wells that have a depth greater than or equal to the first depth.

5. A method of manufacturing an integrated circuit device, the method comprising:

providing a semiconductor body having a first side and a second side opposite the first side;

etching trenches in the first side, wherein the trenches form a grid;

depositing sacrificial material in the trenches from the first side;

etching from the first side so as to recess the sacrificial material within the trenches and create first trench recesses, wherein the first trench recesses have a first depth;

forming a first semiconductor structure in the semiconductor body by depositing a first semiconductor material within the first trench recesses, wherein forming the first semiconductor structure comprises epitaxial growth of the first semiconductor material within the first trench recesses;

thinning the semiconductor body from the second side;

etching the sacrificial material from the second side so as to create second trench recesses, wherein the second trench recesses extend from the second side to the first semiconductor structure; and depositing dielectric in the second trench recesses.

6. The method of claim 1, wherein the first semiconductor material is polysilicon and the first depth is one fourth or less than a depth of the trenches.

7. A method of manufacturing an integrated circuit device, the method comprising:

providing a semiconductor substrate having a first side and an opposite second side;

etching trenches in the first side, wherein the trenches form a grid;

depositing sacrificial material in the trenches from the first side;

etching from the first side so as to recess the sacrificial material within the trenches and create first trench recesses, wherein the first trench recesses have a first depth;

depositing a second material in the first trench recesses and filling the first trench recesses, wherein the second material is distinct from the sacrificial material;

forming a mask on the first side, wherein the mask covers first portions of the filled first trench recesses and has openings over second portions of the filled first trench recesses;

etching through the openings in the mask to form holes, wherein the holes have a lesser depth than the first trench recesses;

filling the holes, wherein filling the holes forms semiconductor structures within the holes;

thinning the semiconductor substrate from the second side;

etching the sacrificial material from the second side so as to create second trench recesses, wherein the etch process stops on the second material; and depositing dielectric in the second trench recesses.

8. The method of claim 7, wherein the semiconductor structures within the holes have a crystal structure continuous with the semiconductor substrate.

9. The method of claim 7, wherein the holes are wider than the trenches.

10. The method of claim 7, wherein the holes are disposed over crossroads of the grid.

11. The method of claim 7, wherein filling the holes comprises sequentially depositing a dielectric material and a semiconductor material.

12. The method of claim 11, further comprising etching to recess the dielectric material within the holes prior to depositing the semiconductor material.

13. The method of claim 7, wherein the semiconductor structures within the holes provide floating diffusion regions.

14. The method of claim 1, further comprising forming a front side metal interconnect structure with an electrical connection to the semiconductor structures within the holes.

15. The method of claim 7, further comprising:

thermally processing the semiconductor substrate, wherein thermally processing the semiconductor substrate reduces defects created during a process of forming the trenches; and after thermally processing the semiconductor substrate, forming semiconductor devices on the first side.

16. The method of claim 7, further comprising:

forming photodiodes that are separated by the grid; and forming transfer gates, wherein the transfer gates are configured to transfer charge from the photodiodes to floating diffusion regions that are provided by the semiconductor structures within the holes.

17. The method of claim 16, wherein forming transfer gates comprises etching second holes in the semiconductor substrate and depositing a gate dielectric and a gate electrode within the second holes.

18. The method of claim 17, further comprising forming a front side metal interconnect structure with electrical connections to the floating diffusion regions.

19. The method of claim 18, wherein filling the holes comprises epitaxially growing the semiconductor structures.

20. The method of claim 7, wherein the second material is polysilicon.

* * * * *